United States Patent
Kunimoto et al.

(10) Patent No.: US 8,347,256 B2
(45) Date of Patent: Jan. 1, 2013

(54) SYSTEM AND METHOD OF ASSISTING CIRCUIT DESIGN

(75) Inventors: Masahiko Kunimoto, Kanagawa (JP); Kazuaki Suzue, Kanagawa (JP); Satoko Sakai, Kanagawa (JP)

(73) Assignee: Ricoh Company, Limited, Tokyo (JP)

( * ) Notice: Subject to any disclaimer, the term of this patent is extended or adjusted under 35 U.S.C. 154(b) by 156 days.

(21) Appl. No.: 12/881,491

(22) Filed: Sep. 14, 2010

(65) Prior Publication Data

US 2011/0066994 A1 Mar. 17, 2011

(30) Foreign Application Priority Data

Sep. 15, 2009 (JP) ................................. 2009-213643

(51) Int. Cl.
*G06F 17/50* (2006.01)
(52) U.S. Cl. ......... 716/122; 716/118; 716/119; 716/136
(58) Field of Classification Search .................... 716/122
See application file for complete search history.

(56) References Cited

U.S. PATENT DOCUMENTS

2005/0273736 A1* 12/2005 Youngman et al. ............... 716/4
2008/0005713 A1* 1/2008 Singh et al. ..................... 716/11

FOREIGN PATENT DOCUMENTS

| JP | 2009-146003 | 7/2009 |
| JP | 2010-157194 | 7/2010 |

* cited by examiner

*Primary Examiner* — Paul Dinh
*Assistant Examiner* — Bryce Aisaka
(74) *Attorney, Agent, or Firm* — Oblon, Spivak, McClelland, Maier & Neustadt, L.L.P.

(57) ABSTRACT

A circuit design assist system that receives a user instruction for registering an interface section of at least two circuits as a template, and generates a plurality of circuit patterns of the interface section, each pattern having a different combination of electrical properties of at least one device included in the interface section for evaluation. When an evaluation result indicates that the interface section operates normally for each of the circuit patterns, the circuit design assist system registers the interface section as the template.

9 Claims, 10 Drawing Sheets

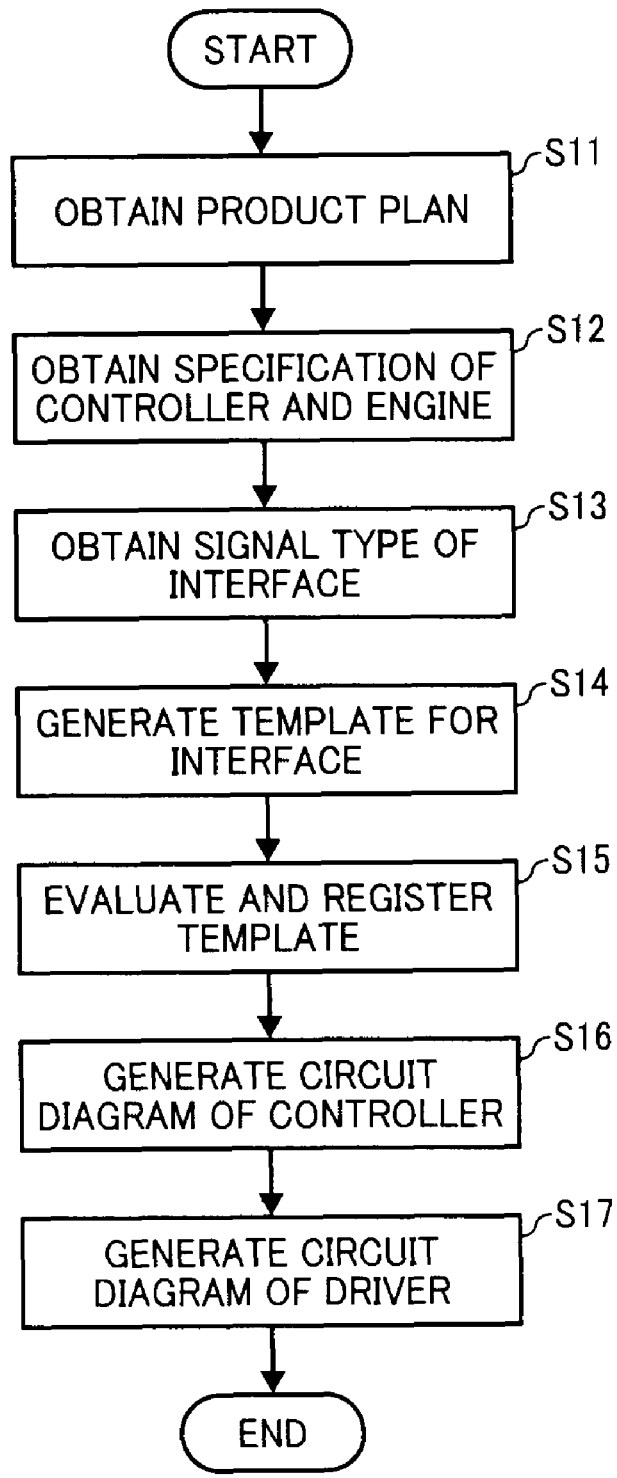

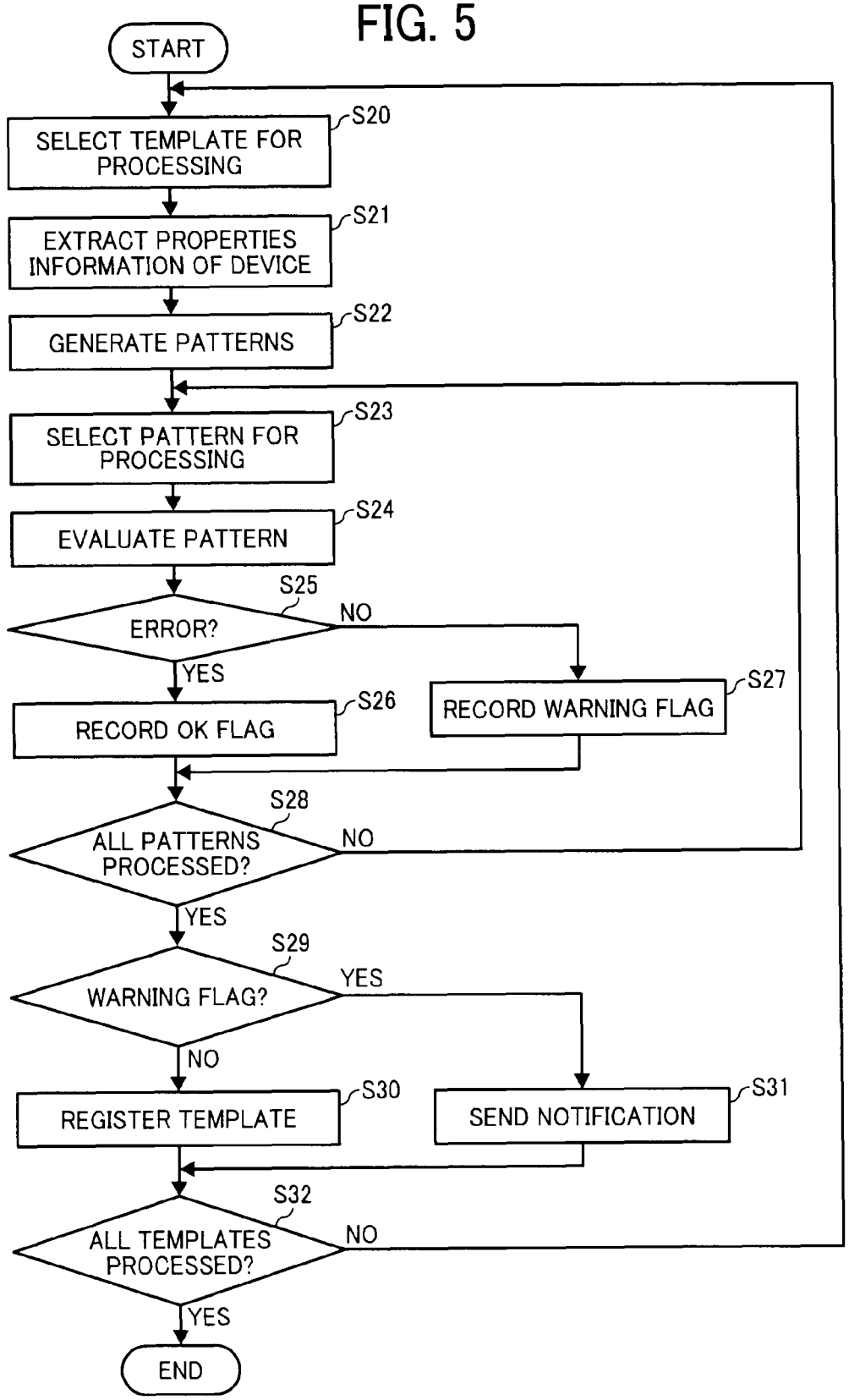

|  | RESISTANCE PROPERTY | T2 EQUIVALENT | T1 EQUIVALENT OR BASE INPUT OF DIGITAL TRANSISTOR |
|---|---|---|---|
| PATTERN 1 | +5VE | PROPERTY 1 | PROPERTY 1 |
| PATTERN 2 | +5VE | PROPERTY 1 | PROPERTY 2 |
| PATTERN 3 | +5VE | PROPERTY 1 | PROPERTY 3 |
| PATTERN 4 | +5VE | PROPERTY 1 | BASE INPUT OF DIGITAL TRANSISTOR |
| PATTERN 5 | +5VE | PROPERTY 2 | PROPERTY 1 |
| . . . | . . . | . . . | . . . |
| PATTERN n | +3.3VE | PROPERTY 3 | BASE INPUT OF DIGITAL TRANSISTOR |

SYSTEM AND METHOD OF ASSISTING CIRCUIT DESIGN

CROSS-REFERENCE TO RELATED APPLICATIONS

This patent application is based on and claims priority pursuant to 35 U.S.C. §119 to Japanese Patent Application No. 2009-213643, filed on Sep. 15, 2009, in the Japanese Patent Office, the entire disclosure of which is hereby incorporated herein by reference.

FIELD OF THE INVENTION

The present invention generally relates to a system and a method of assisting a user in circuit design, and more specifically to a system and a method of assisting a user in designing a circuit that transmits or receives a signal with another circuit.

BACKGROUND

In the process of designing circuits such as printed circuit boards (PCBs), a user usually checks the design of each PCB for all electrical connections based on properties of one or more devices included in each PCB. For example, Japanese Patent Application Publication No. 2009-146003A discloses a system for checking the electrical connection between two different PCBs based on information regarding particular devices of the PCBs that are provided at an interface section where these PCBs are connected.

However, if completion of the design process for one of the PCBs is delayed, the information regarding the devices may not be available. In such case, the system of Japanese Patent Application Publication No. 2009-146003A constructs a circuit structure of the interface section based on the design specification of a signal that will be transmitted through a harness cable that connects these PCBs at the interface section.

In order to prepare the design specification of the signal, the user is required to consider all possible circuit structures of the interface section, and check which one of the possible circuit structures is operable based on information regarding devices provided at the interface section. However, checking all possible circuit structures of the interface section has been difficult as the user, accidentally or purposefully, may overlook or fail to check one or more possible circuit structures.

Further, even after the user has decided one or more circuit structures of the interface section to be used as the design specification of the signal, the user is required to register the circuit structures of the interface section into the system. For example, at the registration process, the system requests the user to manually input various property information of each device provided at the interface section or draw a circuit diagram of the interface section. Since information regarding the design specification is manually input by the user, the system may accidentally register inaccurate information if the user inputs inaccurate information in error.

SUMMARY

In view of the above, there is a need for a technique of assisting the user in designing a circuit with improved efficiency and accuracy.

Example embodiments of the present invention include an apparatus, method, system, computer program and product each capable of assisting a user in designing a circuit. When a circuit design assist system receives a user instruction for registering an interface section of at least two circuits as a template, the design circuit assist system generates a plurality of circuit patterns of the interface section, each pattern having different combination of electrical properties of at least one device included in the interface section for evaluation. When an evaluation result indicates that the interface section operates normally for each of the circuit patterns, the circuit design assist system registers the interface section as the template.

Example embodiments of the present invention include an apparatus, method, system, computer program and product each capable of assisting a user in designing a circuit. When a circuit design assist system receives a user instruction for registering an interface section of at least two circuits as a template, the circuit design assist system registers a record to template management data stored in a memory. The record of the template management data includes a signal identifier for specifying a signal to be transmitted through a signal transmission line that connects the at least two circuits, a device identifier for specifying the at least one device of the interface section, and circuit schematic information for specifying electrical connections of the at least one device of the interface section. When the system further receives a user instruction for specifying a signal identifier, the system extracts circuit schematic information of a record of the template management data having the signal identifier specified by the user instruction, and displays data generated based on the extracted circuit schematic information on a screen to allow the user to design a new circuit using the extracted circuit schematic information.

In addition to the above-described example embodiments, the present invention may be practiced in various other ways.

BRIEF DESCRIPTION OF THE DRAWINGS

A more complete appreciation of the disclosure and many of the attendant advantages and features thereof can be readily obtained and understood from the following detailed description with reference to the accompanying drawings, wherein:

FIG. 4 is a flowchart illustrating operation of assisting a user in circuit design, performed by the system of FIG. 1, according to an example embodiment of the present invention;

FIG. 5 is a flowchart illustrating operation of evaluating operability of a template and registering the template, performed by the system of FIG. 1, according to an example embodiment of the present invention;

Figure 1:
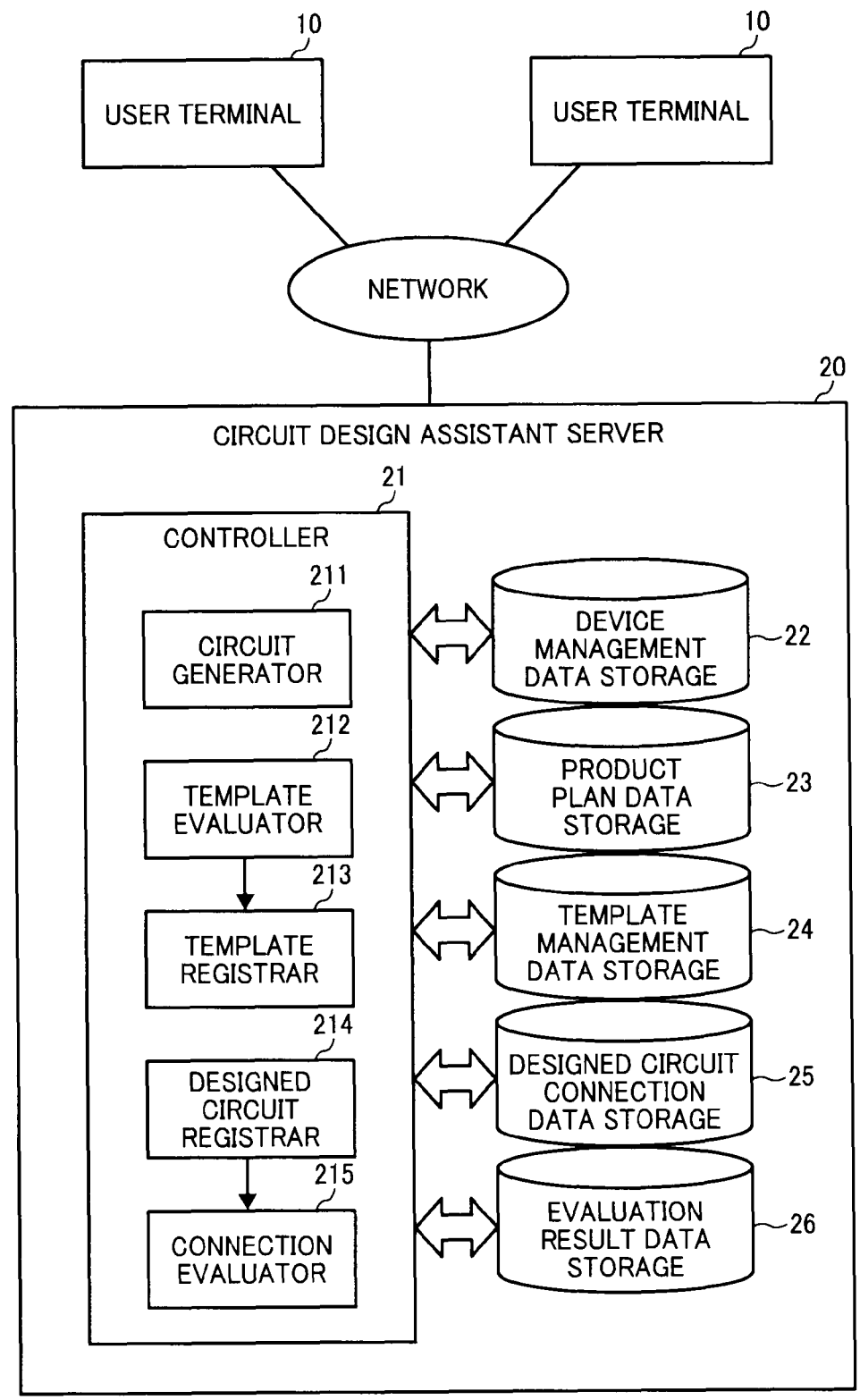
FIG. 1 is a schematic block diagram illustrating a circuit design assist system, according to an example embodiment of the present invention.

The accompanying drawings are intended to depict example embodiments of the present invention and should not be interpreted to limit the scope thereof. The accompanying drawings are not to be considered as drawn to scale unless explicitly noted.

DETAILED DESCRIPTION OF EXAMPLE EMBODIMENTS

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

In describing example embodiments shown in the drawings, specific terminology is employed for the sake of clarity. However, the present disclosure is not intended to be limited to the specific terminology so selected and it is to be understood that each specific element includes all technical equivalents that operate in a similar manner.

Referring now to FIGS. 1 to 12, a circuit design assist system is explained according to an example embodiment of the present invention. In the following example, it is assumed that the circuit design assist system of FIG. 1 assists a user in designing a circuit to be incorporated in a multifunctional apparatus (MFP). The MFP incorporates therein a plurality of printed circuit boards, each of which has a circuit mounted thereon. Further, the MFP at least includes an engine section that drives an image forming unit of the MFP, and a controller section that controls the engine section through a signal that is transmitted to or received from the engine section. In the following example, it is assumed that the user designs a circuit to be mounted on a printed circuit board of the engine section that drives the image forming unit to provide a scanner function or a copy function through the image forming unit, and a circuit to be mounted on a printed circuit board of the controller section that controls the engine section.

As illustrated in FIG. 1, the circuit design assist system of FIG. 1 includes a circuit design assist server 20, which is connected to a plurality of user terminals 10 through a network. The user terminal 10 ("the terminal 10") is a computer terminal, which is operated by a user who is a circuit designer.

The terminal 10 includes a controller unit, an input unit, a display unit, and a communication unit. The controller unit includes a processor such as a central processing unit (CPU), and a memory such as a random access memory (RAM) and a read only memory (ROM). The input unit may be implemented by any desired device that allows the user to input a user instruction including, for example, a keyboard, a pointing device such as a mouse, a speaker, etc. The display unit may be implemented by any desired device that outputs information to the user such as a liquid crystal display (LCD). Further, the input unit and the display unit may be integrated into one device, for example, as a touch panel screen. The communication unit may be implemented by any desired device that allows data transmission such as a network interface controller (NIC). Further, in this example, the controller unit of the terminal 10 previously stores a circuit design program.

Figure 10:
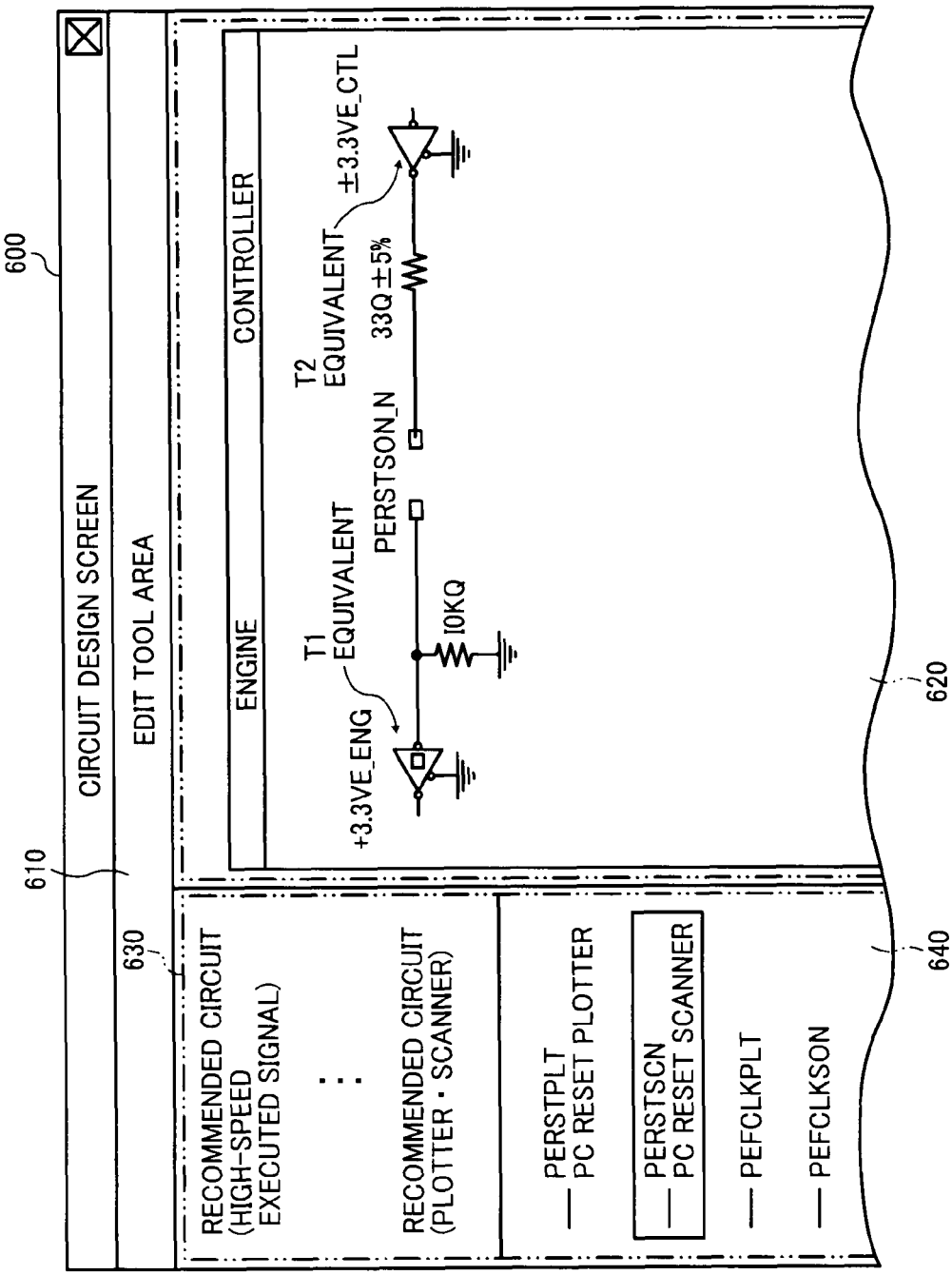
FIG. 10 is an example circuit design screen displayed by the system of FIG. 1.

Upon execution of the circuit design program according to a user instruction received from the user, the controller unit of the terminal 10 communicates with the circuit design assist server 20 for data transmission or reception. The circuit design program is stored with various data such as menu screen data, circuit information input screen data, and circuit design screen data. Based on the menu screen data, the terminal 10 displays a menu screen including a registration button, a template creation button, and a circuit creation button. Based on the circuit information input screen data, the terminal 10 displays a circuit information input screen, which allows the user to input various information regarding the circuit to be generated. For example, the circuit information input screen includes an input field for inputting a name and a type of a signal to be transmitted or received by the template circuit to be generated, an input field for inputting an identifier (ID) assigned to a printed circuit board on which the circuit to be generated is mounted, an input field for inputting an identifier assigned to a machine incorporating such printed circuit board, etc. Based on the circuit design screen data, the terminal 10 displays a circuit design screen, which allows the user to generate a circuit. For example, as illustrated in FIG. 10, the circuit design screen includes an edit tool area and a circuit creation area. The edit tool area includes a device type selection button that allows the user to search for a specific device, a connection tool that allows the user to design terminal connections of each device, an input field for inputting a specification value of property information of an interface, a registration button, etc.

The controller unit of the terminal 10 further includes an internal memory, which stores information regarding wiring connections generated using a tool or a button that is displayed in the edit tool area, as a circuit wiring record. The circuit wiring record includes various data regarding a device address, device ID, pin number, signal ID, and template ID. For example, the circuit wiring record includes a device address data area, a device ID data area, a pin number data area, a signal ID data area, and a template ID data area.

The device address data area stores therein data regarding a position of a specific device that is arranged in the circuit. The device ID data area stores therein a device ID, which is an identifier for identifying the specific device.

The pin number data area stores therein various data regarding a pin number assigned to a terminal, or a node, of the specific device. The signal ID data area stores therein various data regarding a signal ID, which is an identifier for specifying a signal to input to the terminal of the pin with the specific pin number.

The template ID data area stores therein a template ID, which is an identifier for specifying a template used for arranging the specific device in the circuit. The controller unit of the terminal 10 further causes the display unit to display various screens based on various data obtained from the circuit design assist server 20. The controller unit further obtains various numerical data or user instruction through the input unit.

Referring to FIG. 1, the circuit design assist server 20 includes a controller 21, a device management data storage 22, a product plan data storage 23, a template management data storage 24, a designed circuit connection data storage 25, and an evaluated result data storage 26.

The controller 21 includes a processor such as a CPU, and a memory such as a RAM and ROM. Using the processor and the memory, the controller 21 performs various operations including, for example, template evaluation operation, template registration operation, template display operation, and designed circuit registration operation. More specifically, the memory stores the circuit design assist program which, when executed, causes the processor of the controller 21 to have a circuit generator 211, a template evaluator 212, a template registrar 213, a designed circuit registrar 214, and a connection evaluator 215.

The circuit generator 211 provides a function of displaying a template to the user in order to assist the user in designing a circuit through the terminal 10. More specifically, the circuit generator 211 sends various data stored in any one of the storages 22 to 25 to the terminal 10 according to a request sent by the terminal 10.

The template evaluator 212 checks a circuit schematic of the template received with a user instruction for registering the template. The template registrar 213 stores the circuit schematic of the template in the template management data storage 24.

The designed circuit registrar 214 generates a designed circuit connection record 250 regarding the designed circuit, and registers the designed circuit connection record 250 in the designed circuit connection data storage 25. The connection evaluator 215 checks connection of the designed circuit using the designed circuit connection record 250.

Figure 2:
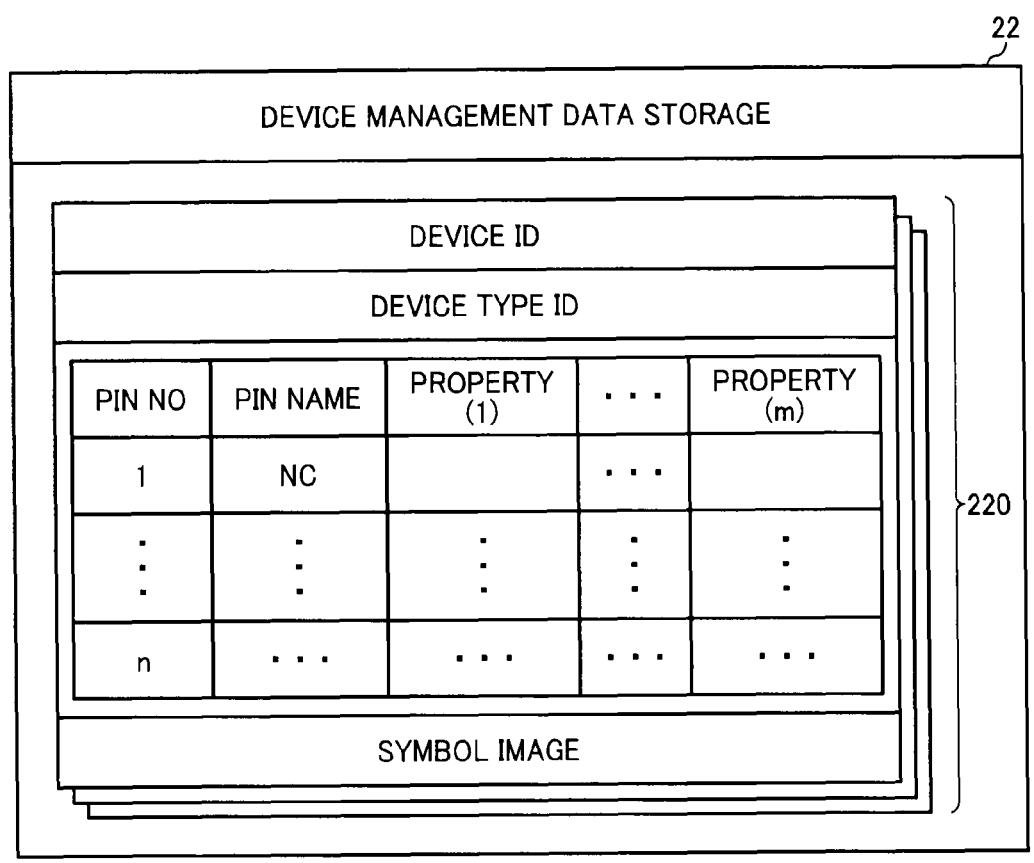
FIG. 2 is a structure of data stored in a device management data storage of the system of FIG. 1.

As illustrated in FIG. 2, the device management data storage 22 stores one or more device management records 220 used for device management. The device management record 220 is stored when various data regarding a specific device is input. Examples of device include resistors, capacitors, transistors, diodes, and switches. The device management record 220 includes a device ID data area, a device type ID data area, characteristics table data area, and a symbol image data area.

The device ID data area stores therein data regarding the device ID, which is an identifier for specifying a specific device. The device type ID data area stores therein data regarding a device type ID, which is an identifier for specifying a type of the specific device. For example, the device type ID may indicate whether the specific device is a signal transmission line, inverter, buffer, etc.

The characteristics table data area stores therein various data regarding a configuration, or a specification value or characteristics value, of property of the specific device. Examples of device configuration include a pin number and a pin name of the device. Examples of specification or characteristics values include frequency fluctuations, responsiveness, and supply voltage.

The symbol image data area stores therein various data regarding a graphical image that reflects the specific device such as an electronic symbol of the specific device.

Referring back to FIG. 1, the product plan data storage 23 stores product plan data regarding the product plan. The circuit design assist server 20 stores the product plan data in the product plan data storage 23 when the terminal 10 receives a user input regarding the specification of the controller section or the engine section to be used for the product that is planned to be developed, or the type of signal to be used for the interface between the controller section and the engine section. The product plan data includes one or more product family plan records, and one or more machine-specific plan records each generated for one product family plan record. The product family plan record includes a product family ID data area, a machine type ID data area, and a schedule information data area.

The product family ID data area stores therein a product family ID, which is an identifier for identifying a product family to be designed, manufactured, or sold at a predetermined time. The machine type ID data area stores therein various data regarding a machine type ID, which is an identifier for specifying each product in the product family.

The schedule information data area stores various data regarding the design process, manufacturing process, or selling process of each product in the product family. For example, the schedule information data area stores information regarding the date for completing the design process of the product, the date for completing the manufacturing process of the product, and the date for starting sales of the product.

The machine-specific plan record stores therein various data regarding each product in the product family, which is specified by the machine type ID of the product family plan record. The machine-specification plan record stores the machine type ID of each product, the specification of each product, the signal name and signal type of the signal used for each product, etc. For example, the machine-specific plan record includes a machine-specific data area, a specification data area, a signal name data area, and a signal type data area.

The machine-specific data area stores therein data regarding a machine type ID, which is an identifier for specifying a machine type of a specific machine or product. The specification data area stores therein data regarding the specification of the specific machine such as the characteristics or functionality of the specific machine.

The signal name data area stores therein various data regarding a name of a signal to be used by the specific machine. In this example, the signal name data area stores information regarding a name of a signal to be transmitted or received between the controller section and the engine section. The signal type data area stores therein various data for specifying a type of the signal.

Figure 3A:
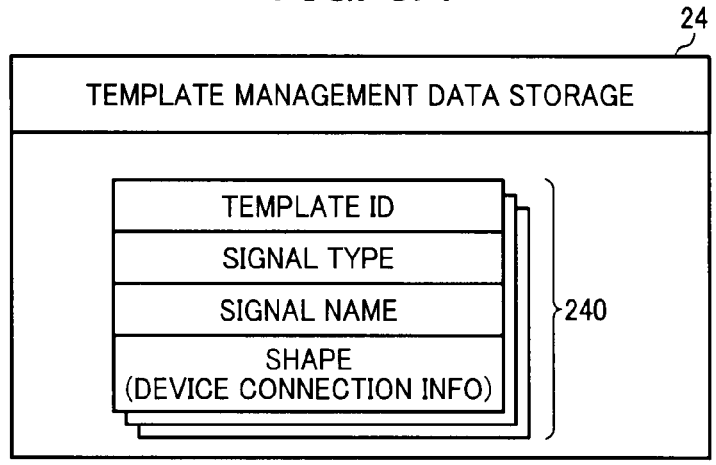
FIG. 3A is a structure of data stored in a template management data storage of the system of FIG. 1.

As illustrated in FIG. 3A, the template management data storage 24 stores one or more template management records 240, each record indicating a schematic or configuration of a circuit section to be used as a template. In this example, the template management record 240 stores information regarding a configuration of a circuit designed for signal transmission or reception of an interface that connects the controller section and the engine section. The template management record 240 is generated from the circuit wiring record received from the terminal 10, and stored when the template registration process is completed. The template management record 240 includes various data regarding a template ID, signal type, signal name, and shape. For example, as illustrated in FIG. 3A, the template management record 240 includes a template ID data area, a signal type data area, a signal name data area, and a shape data area.

The template ID data area stores various data regarding a template ID, which is an identifier for specifying a specific circuit schematic that is registered as a template. The signal type data area stores various data regarding a type of signal to be transmitted or received by the template circuit assigned with a specific template ID. Examples of signal type include a scanner related signal type and a high-speed response signal type. The signal name data area stores therein various data regarding a signal name, or a signal identifier, for identifying a signal to be transmitted or received by the template circuit.

Figure 3B:
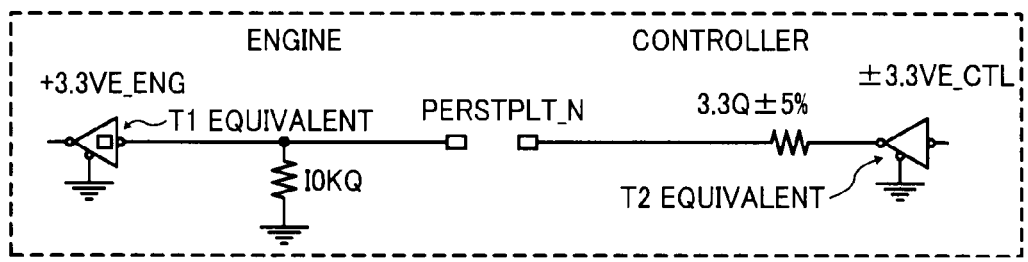
FIG. 3B is a structure of shape data stored in the template management data storage of FIG. 3A.

The shape data area stores various shape data regarding the template circuit configuration. As illustrated in FIG. 3B, the shape data includes, for example, a symbol image of a specific device connected to a signal transmission line of the signal, a device address of the specific device, a device identifier of the specific device, a node terminal of the specific device to be connected to the signal transmission line, etc. For example, the shape data includes a circuit image data area, a device address data area, a device ID data area, and a node terminal data area.

The circuit image data area stores various data regarding the image of the template circuit. For example, the circuit image includes a symbol image of the specific device as well as the device ID of the specific device.

The device address data area stores therein various data regarding an address for specifying the arrangement of a specific device on the template circuit.

The device ID data area stores therein various data regarding a device ID, which is an identifier for identifying the specific device.

The node terminal data area stores therein various data regarding a pin number assigned to a pin of the device that is connected to a signal transmission line through which the specific signal having the specific signal name is transmitted.

The shape data further stores therein various data regarding a unit ID for specifying a unit of printed circuit board to which the specific device belongs. In this example, the unit ID for specifying the engine section or the controller section is stored.

Figure 3C:
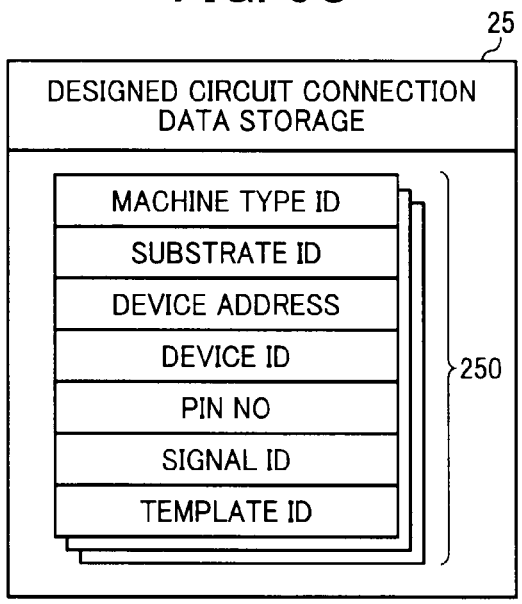
FIG. 3C is a structure of data stored in a designed circuit connection data storage of the system of FIG. 1.

As illustrated in FIG. 3C, the designed circuit connection data storage 25 stores a designed circuit connection record 250 regarding the designed circuit. The designed circuit connection record 250 is stored when a registration instruction is received after completion of the design process. The designed circuit connection record 250 includes various data regarding a machine type ID, a substrate ID, device address, device ID, pin number, signal ID, and template ID. For example, as illustrated in FIG. 3C, the designed circuit connection record 250 includes a machine type ID data area, a substrate ID data area, a device address data area, a device ID data area, a pin number data area, a signal ID data area, and a template ID data area.

The machine type ID data area stores various data regarding a machine type ID, which is an identifier for specifying a specific machine that incorporates the designed circuit. In this example, a specific type of MFP incorporating the designed circuit is specified. The substrate ID data area stores various data regarding a substrate ID, which is an identifier for specifying a printed circuit board on which the designed circuit is mounted.

The device address data area stores various data regarding an address for specifying the arrangement of the device on the printed circuit board. The device ID data area stores various data regarding a device ID for specifying the device used for the circuit.

The pin number data area stores therein various data regarding a pin number, which is an identifier for specifying a terminal included in the device. The signal ID data area stores therein various data regarding a signal ID, which is an identifier for specifying a signal processed by a terminal to which a pin with a specific pin number is connected. In this example, the signal name is used as the signal ID.

The template ID data area stores therein various data regarding a template ID, which is an identifier for specifying the template used for arranging the device on the circuit. When the circuit is designed without using any template ID, the template ID data area storage stores no data.

Figure 3D:
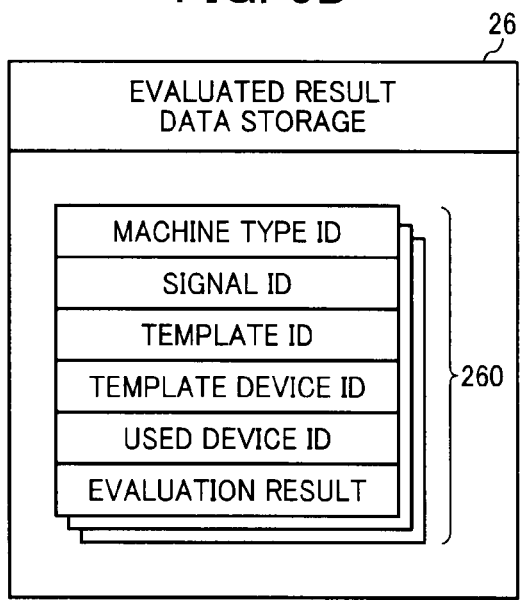
FIG. 3D is a structure of data stored in an evaluated result data storage of the system of FIG. 1.

As illustrated in FIG. 3D, the evaluated result data storage 26 stores an evaluated result record 26 regarding the result of evaluating the designed circuit. In one example, the circuit design assist server 20 stores the evaluated result record 260 when an actual apparatus implemented with the device connected to the signal transmission line of a specific signal is tested for evaluation. The evaluation result record 260 includes various data regarding a machine type ID, a signal ID, a template ID, a device ID of the template, a used device ID, and an evaluation result. For example, as illustrated in FIG. 3D, the evaluated result record 260 includes a machine type ID data area, a signal ID data area, a template ID data area, a device ID data area, a used device ID data area, and an evaluation result data area.

The machine type ID area stores therein various data regarding a machine type ID, which is an identifier for specifying a type of the MFP incorporating the evaluated circuit. The signal ID data area stores therein various data regarding a signal ID for specifying a signal of a wiring pattern that is evaluated. In this example, the signal name is used as the signal ID.

The template ID data area stores therein various data regarding a template ID, which is an identifier for specifying a template used for the evaluated wiring pattern. The template device ID data area stores therein various data regarding a device ID for identifying the device of the template.

The used device ID data area includes various data regarding a device ID for specifying a specific device that is actually used for the circuit. The evaluation result data area stores therein various data regarding the evaluation result of the specific device. When an error is generated, an error flag is stored as the evaluation result. When there is no error, an OK flag is stored as the evaluation result.

Referring now to FIGS. 4 to 12, operation of designing a circuit using the circuit design assist server 20 is explained according to an example embodiment of the present invention.

Referring to FIG. 4, operation of assisting the user in designing a circuit for the MFP, performed by the circuit design assist system of FIG. 1, is explained.

At S11, the circuit design assist sever 20 obtains a product plan for the MFP, which is developed by the user through the terminal 10. More specifically, in this example, the user develops a manufacturing plan for manufacturing a family of MFP products for sales using the terminal 10. The family of MFP products includes various products from a high-functionality machine to a low-functionality machine. Further, schedules relating to the design process, the manufacturing process, and the selling process are respectively defined for each MFP product. The controller 21 of the circuit design assist server 20 obtains a product family plan that stores a product family ID for identifying a product family, a machine type ID for identifying each of the products in the product family, and schedule information for each of the products in the product family, in a corresponding manner, from the terminal 10. Based on the obtained product family plan, the controller 21 of the circuit design assist sever 20 generates a product family plan record, and stores the product family plan record in the product plan data storage 23.

At S12, the circuit design assist server 20 obtains the specification of the controller section and the engine section to be used for the MFP, which is developed by the user through the terminal 10. More specifically, the user defines the specification, or characteristics, of the controller section and the engine section based on a plurality of functions of each product developed at S11. The user preferably defines the specification of the controller section and one or more devices of the engine section for each product, such that the controller section and the device in the engine section may be commonly used for all or most products in the product family. The controller 21 of the circuit design assist server 20 stores the specification of the controller section and the engine section that is defined for each product, in association with the machine type ID of each product, in the product plan data storage 23.

At S13, the circuit design assist server 20 obtains information regarding a signal to be exchanged through an interface of the controller section and the engine section, which is defined by the user through the terminal 10. At this step, for each of the products in the product family, a type and a name of signal to be transmitted or received between the controller section and the engine section is defined based on the specification defined at S12. The controller 21 of the circuit design assist server 20 generates a machine-specific plan record that stores the type and name of signal that is defined in association with the machine type ID of each product, and stores the machine-specific plan record in the product plan data storage 23.

At S14, the circuit design assist server 20 generates, for each product, a template for the interface between the controller section and the engine section based on the signal type determined at S13, according to a user instruction. More specifically, the user determines various characteristics such as a voltage to be applied to the signal transmitted or received between the controller section and the engine section, and a device for controlling the impedance of the signal. In this example, the device is selected from a list of devices that are available for use.

In operation, the user executes the circuit design program stored in the controller unit of the terminal 10 by inputting a user instruction through the input unit of the terminal 10. According to the user instruction, the terminal 10 executes the circuit design program to display a menu screen on the display unit based on the menu screen data. As described above, the menu screen includes the template creation button and the circuit creation button. When the user selects the template creation button, the terminal 10 displays a circuit information input screen on the display unit based on the circuit information input screen data. The circuit information input screen includes an input field for inputting a name or a type of a signal to be transmitted by a template circuit to be designed, and a design start button. The user inputs the name or the type of the signal in the input field, and selects the design start button. The terminal 10 obtains information regarding the signal name or the signal type for the template circuit to be generated, and stores the obtained information in its internal memory.

When the user selects the design start button, the terminal 10 displays a circuit design screen on the display unit based on the circuit design screen data to assist the user in designing a template circuit. For example, the circuit design screen may display a plurality of device type selection buttons, with each button representing a specific device type that the user can design. The user specifies a device type by selecting one of the device type selection buttons displayed in the circuit design screen. The terminal 10 sends information regarding the selected device type to the circuit design assist server 20 such as a device type ID of the selected device.

The controller 21 of the circuit design assist server 20 obtains a device management record 220 that corresponds to the device type ID that is obtained from the terminal 10, from the device management data storage 22, and sends the obtained device management record 220 to the terminal 10. The terminal 10 displays a list of symbol images obtained from the device management record 220 on the circuit design screen. As described above referring to FIG. 2, each symbol image reflects a specific device. The user selects a symbol image of a specific device from the list of symbol images being displayed. The terminal 10 displays the symbol image of the selected device in a circuit creation area of the circuit design screen. The user designs wiring of the device, such as wiring that connects a terminal of the device to another terminal, using a connection tool of the edit tool area. The user repeats this operation of selecting a device and designing terminal connections to complete the design process of the template circuit.

Figures 9A, 9B:
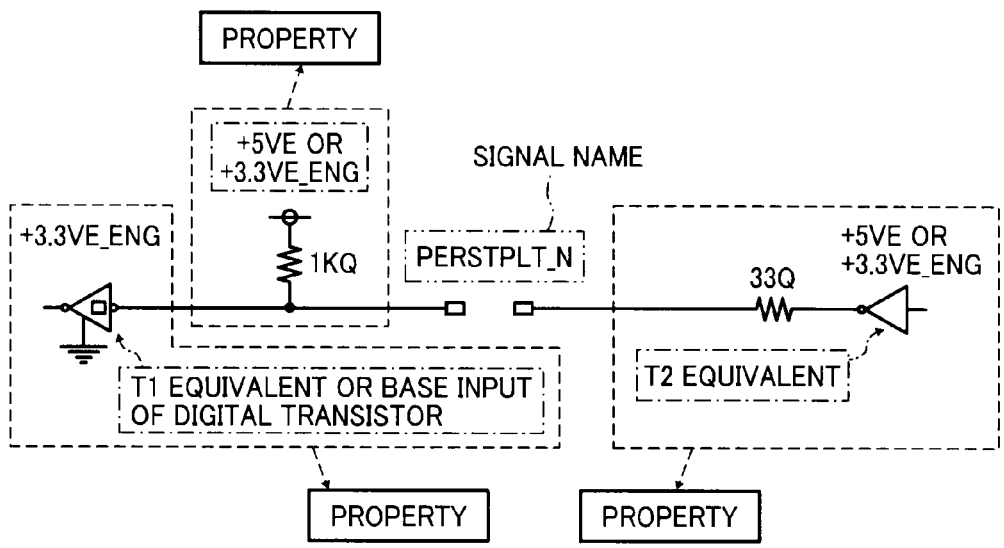
FIG. 9A is an illustration for explaining property information of each device of a designed circuit, according to an example embodiment of the present invention.
FIG. 9B is an example table storing a plurality of circuit patterns of the designed circuit of FIG. 9A, each having different specification values of the property information.

Further, at this time, the user inputs information regarding characteristics or specification of the interface, i.e., the template circuit, through an input field for inputting a specification or characteristics value of the interface. For example, as illustrated in FIG. 9A, the user may input a specification value of property information of each device such as the applied voltage of the signal.

When the template creation is completed, the user selects a registration button in the edit tool area of the circuit design screen. The terminal 10 obtains the device ID of the specific device that is displayed in the circuit creation area, information regarding terminal connections of the device, and the specification value of property information of the interface, to generate shape data. The terminal 10 further associates the signal name and the signal type, which are previously stored in the internal memory, to the shape data to generate a template design record. The template design record is sent to the circuit design assist server 20. The controller 21 of the circuit design assist server 20 stores the template design record in the internal memory.

Referring back to FIG. 4, at S15, the circuit design assist server 20 evaluates operability of the template to generate an evaluation result, and registers the template based on the evaluation result. The circuit design assist server 20 obtains property information of the selected device to be included in the template, and evaluates operability of the template based on the property information. This operation performed at S15 is described below referring to FIG. 5.

At S16, the circuit design assist server 20 generates a circuit diagram of the controller section. At this time, the circuit design assist server 20 refers to the manufacturing plan to consider the functions that may be commonly shared among a plurality of products to be designed within a predetermined time period. Based on information regarding the common functions, the circuit design assist server 20 generates the circuit of the controller section such that the common functions can be provided as on package. Further, at S16, the circuit design assist server 20 may perform simulation of the designed circuit of the controller section. The operation performed at S16 is described below referring to FIG. 6.

At S17, the circuit design assist server 20 generates a circuit diagram of the engine section. The circuit design assist server 20 generates a circuit diagram of the engine section using the template that has been registered at S15 at least for an interface section that interacts with the controller section for data transmission or reception. In this example, the circuit design assist server 20 selects one or more devices in the engine section based on property information of the circuit of the controller section, which is previously determined at S16. The operation performed at S17 is described below referring to FIG. 7. After completion of the design process for the controller section and the engine section, the operation ends.

Referring now to FIG. 5, operation of evaluating operability of the template and registering the template based on an evaluation result, which is performed at S15 of FIG. 4, is explained according to an example embodiment of the present invention.

In this operation, the controller 21 of the circuit design assist server 20 evaluates operability of the template that is created at S14 of FIG. 4 based on property information regarding one or more devices that are selected for the template. More specifically, the controller 21 of the circuit design assist server 20 inputs specification values of property information obtained from the terminal 10 to a circuit simulator for operability evaluation. In this example, any desired circuit simulation program may be provided at the circuit design assist server 20 to perform the function of circuit simulation. When the evaluation result indicates an error, the controller 21 sends notification to the terminal 10 to request the user at the terminal 10 to select another device. When the evaluation result indicates a successful result, the controller 21 registers the template design record in the template management data storage 24 as template management data. In alternative to performing this circuit simulation operation using the circuit simulator, operability of the template may be evaluated using the actual device. Further, in this example, the user may generate any number of templates at S14 of FIG. 14.

At S20, the controller 21 of the circuit design assist server 20 selects a template from one or more templates that are generated at S14 of FIG. 4.

At S21, the controller 21 of the circuit design assist server 20 extracts property information of a device that is selected for the template circuit that is selected at S20. More specifically, for the selected template, the template evaluator 212 of the controller 21 obtains property information of the device that corresponds to the device ID of the shape data that is previously stored, from the device management data storage 22. For example, as illustrated in FIG. 9A, the property information may indicate an applied voltage of the signal, a terminal of the device, etc.

At S22, the controller 21 of the circuit design assist server 20 generates a plurality of patterns of circuit schematics or structures based on the property information obtained at S21. For example, as illustrated in FIG. 9B, the controller 21 generates a plurality of patterns of circuit schematics, each pattern including a different combination of specification values of property information, and stores the plurality of patterns in its internal memory in the form of table 500.

At S23, the controller 12 of the circuit design assist server 20 selects a pattern for operability evaluation from the plurality of patterns generated at S22, as a selected pattern.

At S24, the controller 21 of the circuit design assist server 20 evaluates operability of the selected pattern that is selected at S23. The template evaluator 212 determines whether the selected pattern having different device characteristics would operate without causing an error to generate an evaluation result.

At S25, the controller 21 determines whether the evaluation result generated at S24 indicates successful operation. When it is determined that the evaluation result indicates no error ("YES" at S24), the operation proceeds to S26 to record a flag indicating that the selected pattern operates normally. The template evaluator 212 of the controller 21 stores the flag indicating that the selected pattern operates normally in association with the selected pattern that is evaluated. When it is determined that the evaluation result indicates an error ("NO" at S25), the operation proceeds to S27 to record a warning flag indicating warning. The template evaluator 212 of the controller 21 stores the warning flag indicating that an error may be generated in association with the selected pattern that is evaluated.

At S28, the controller 21 of the circuit design assist server 20 determines whether the evaluation result is generated for all patterns that are generated at S22. When it is determined that all patterns are evaluated ("YES" at S28), the operation proceeds to S29. When it is determined that there is at least one pattern that is not evaluated ("NO" at S28), the operation returns to S23 to perform operability evaluation of a pattern that is not processed.

At S29, the controller 21 of the circuit design assist server 20 determines whether there is at least one warning flag that is recorded. When it is determined that at least one warning flag is recorded ("YES" at S29), the operation proceeds to S31. At S31, the template evaluator 212 of the controller 21 sends notification to the terminal 10 regarding the selected template. For example, the template evaluator 212 of the controller 21 generates template correction screen data including specification values of property information of each device of the pattern that is stored with the warning flag, and the shape data of the template, and sends the template correction screen data to the terminal 10. The terminal 10 displays a template correction screen based on the template correction screen data that is received from the circuit design assist server 20. The template correction screen includes an edit tool area, such as the edit tool area that is displayed through the template creation screen. Using the edit tool, the user is able to re-design the template by re-selecting a device or changing the wiring connections. When the user selects a registration button in the edit tool area, the terminal 10 repeats operation of FIG. 5 to evaluate operability of the updated template.

When it is determined that no warning flag is recorded ("NO" at S29), the operation proceeds to S30. At S30, the template registrar 213 of the controller 21 registers the selected template. More specifically, the template registrar 213 of the controller 21 assigns a template ID to the selected template, and generates a template management record 240 that stores the template ID, and various information such as the signal type, signal name, and shape data in a corresponding manner. The template management record 240 for the selected template is stored in the template management data storage 24. At this time, the template registrar 213 of the controller 21 generates a circuit image including a symbol image of each device having a device ID, and stores the circuit image in the template management record 240. Further, as illustrated in FIG. 9A, when any one of the devices in the designed circuit is added with electrical property information indicating that the device is equivalent to another device in characteristics, the controller 21 may add the phrase "equivalent" to the device ID of the symbol image.

At S32, the controller 21 of the circuit design assist server 20 determines whether all templates that are generated at S14 of FIG. 4 are evaluated for operability. When it is determined that all templates have been evaluated ("YES" at S32), the operation ends. When it is determined that there is at least one template that has not been evaluated ("NO" at S32), the operation returns to S20 to evaluate operability of the template.

As described above referring to FIG. 5, when a user instruction for registering a template circuit is received, the system of FIG. 1 automatically generates a plurality of patterns of the template circuit based on property information defined for the template circuit, and automatically evaluates the plurality of patterns of the template circuit. This reduces the workload for the user especially when the template circuit is not clearly defined.

For example, the property information of the circuit illustrated in FIG. 9A has defined with first property information indicating that the applied voltage of the signal can be 5 VE or 3.3 VE, second property information indicating that a device is equivalent to the device T2 in characteristics, and third property information indicating that a device is equivalent to the device T1 or a base input of a digital transistor. In such case, it would be difficult for the user to consider all possible patterns, for example, by referring to specification values of the equivalent device. The system of FIG. 1 automatically generates the table 500 of FIG. 9B, which stores a plurality of patterns each having different combination of specification values of the first, second, and third property information. Further, at the time of registering the template circuit, all possible patterns that are generated for the template circuit are evaluated for its operability, and only the patterns with the successful evaluation result are stored as the template circuit. With this function, the user is able to generate a temple circuit, which is to be used for circuit design, with improved efficiency and accuracy.

Figure 6:
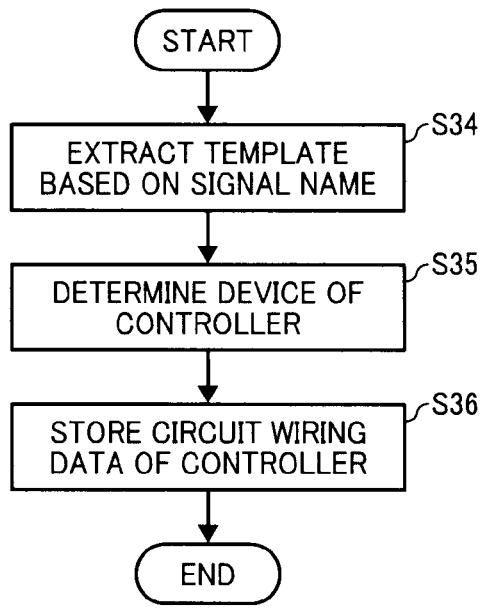
FIG. 6 is a flowchart illustrating operation of generating a circuit diagram of a controller section, performed by the system of FIG. 1, according to an example embodiment of the present invention.

Referring now to FIG. 6, operation of generating a circuit diagram of the controller section, performed at S16 of FIG. 4, is explained according to an example embodiment of the present invention.

According to a user instruction input to the terminal 10, the terminal 10 executes the circuit design program to display the menu screen that includes the circuit creation button. When the circuit creation button is selected, the controller unit of the terminal 10 displays the circuit information input screen based on the circuit information input data. The circuit information input screen includes an input field for inputting a substrate ID of the printed circuit board to be designed, a machine type ID of the MFP that incorporates the printed circuit board, and a design start button. The user inputs the substrate ID and the machine type ID in the input field, and selects the design start button. The terminal 10 stores information regarding the substrate ID and the machine type ID in its internal memory, and sends the machine type ID to the circuit design assist server 20.

The controller 21 of the circuit design assist server 20 extracts the machine-specific plan record that corresponds to the obtained machine type ID, from the product plan data storage 23. The controller 21 obtains information regarding the signal type included in the extracted machine-specific plan record, and sends the signal type information to the terminal 10.

For example, the terminal 10 displays a circuit design screen 600 of FIG. 10. The circuit design screen 600 includes an edit tool area 610, a circuit creation area 620, a signal type list 630, and a signal name list 640. The edit tool area 610 displays therein a tool that allows the user to select a device or wiring connections of the device to design the circuit. The edit tool area 610 further includes a registration button for storing the circuit diagram that is designed. The circuit creation area 620 displays therein a device and wiring connections of the device that is being designed. The signal type list 630 lists a plurality of signal types available for use, which is received from the circuit design assist server 20. When a signal type is selected from the plurality of signal types displayed in the signal type list 630, the signal name list 640 displays one or more template circuits that are previously registered for the selected signal type in the form of graphical image. Together with the graphical image representing the template circuit, a signal name of a signal that is stored in association with the template circuit is displayed.

At S34, the terminal 10 extracts a template based on the signal name. For example, the user selects a specific signal type of a circuit to be designed from the signal type list 630. Upon selection, the terminal 10 sends the selected signal type to the circuit design assist server 20. The circuit generator 211 of the controller 21 extracts one or more template management records 240 that correspond to the selected signal type, from the template management data storage 24. For each of the extracted template management records 240, the controller 21 generates a thumbnail image of the shape data of the extracted template management record 240, and sends the thumbnail image together with the signal name obtained from the template management record 240 to the terminal 10. The terminal 10 displays a set of the thumbnail image and the signal name in the signal name list 640 for each of the templates obtained for the selected signal type.

The user selects a signal name from the signal name list 640. Upon selection, the terminal 10 sends the selected signal name to the circuit design assist server 20. The controller 21 of the circuit design assist server 20 extracts the shape data of the template management record 240 that corresponds to the selected signal name from the template management data storage 24, and sends the obtained shape data to the terminal 10. Based on the received shape data, the terminal 10 displays a circuit schematic of the template such as a device that is connected to a signal transmission line of the signal having the selected signal name as well as its wiring connections, on the circuit creation area 620. In such case, the controller unit of the terminal 10 specifies a device address of each device from the position where the shape data is displayed. The controller unit of the terminal 10 specifies a device ID of the device included in the shape data, a pin number, and a signal ID. The controller unit of the terminal 10 generates circuit wiring data including the device address, device ID, pin number, signal ID, and template ID that are respectively specified, and stores the circuit wiring data in its internal memory. Further, the controller unit of the terminal 10 stores the template ID in association with the signal ID of the signal transmission line being displayed, in its internal memory.

At S35, the terminal 10 determines a device of the controller section. For example, assuming that the user decides to use the device included in the template circuit, which is displayed in the circuit creation area 620 of the circuit design screen 600, for the controller section, the user designs a wiring pattern that connects the determined device to another device. In such case, the controller unit of the terminal 10 generates a circuit wiring record that reflects a user input, and stores the circuit wiring record in its memory.

When the user decides not to use the device included in the template circuit for various reasons such as cost, the user may delete the display of device using the tool displayed in the edit tool area. In such case, the controller unit of the terminal 10 deletes circuit wiring data that includes the device address and the device ID for the deleted device.

After deleting the device that is displayed, the user searches for another device using a tool of the edit tool area. The controller unit of the terminal 10 sends information regarding the selected device type ID to the circuit design assist server 20. At the circuit design assist server 20, the circuit generator 211 of the controller 21 extracts the device management record 220 that corresponds to the received device type ID from the device management data storage 22, and sends the obtained device management record 220 to the terminal 10. The terminal 10 displays the received device management record 220 to the user through the display unit.

The user selects a device to be used for the controller section using information obtained from the device management record 220. For example, the controller unit of the terminal 10 displays a symbol image of the device on the circuit creation screen 620, at a section from which the symbol image of the device is deleted. According to a user instruction, a terminal of the device now displayed is connected to a signal transmission line of the signal that has been displayed based on the template. In such case, the controller unit of the terminal 10 generates circuit wiring data including a device address, device ID, pin number of the terminal connected to the signal transmission line, a signal ID of the signal transmission line, and a template ID that is associated with the signal ID, for the selected device, and stores the circuit wiring data in its internal memory. This process of designing a circuit may be repeated for another portion of the controller section. When the circuit design for the controller section is completed, the user selects the registration button of the edit tool area 610. The controller unit of the terminal 10 sends the circuit wiring data that is previously stored, the machine type ID, and the substrate ID, to the circuit design assist server 20.

At S36, the controller 21 of the circuit design assist server 20 stores the designed circuit wiring data for the controller section. For example, the designed circuit registrar 214 of the controller 21 generates a designed circuit connection record 250 that stores the machine type ID and the substrate ID in association with the circuit wiring record, and stores the designed circuit connection record 250 in the designed circuit connection data storage 25. At this time, the controller 21 may input the designed circuit connection record 250, such as the property information of the device, to the circuit simulator to evaluate operability of the controller section except for the interface section if the interface section has been previously evaluated.

The above-described operation of generating a circuit may be repeated more than once to design any number of circuits for the controller section.

As described above referring to FIG. 6, when designing a circuit, the user inputs a user instruction for specifying a signal name of a signal to be transmitted by an interface section provided between at least two circuits. Based on the signal name, the system of FIG. 1 automatically displays a circuit schematic based on the shape data obtained with respect to the specified signal name, which is previously stored as the template. This reduces the workload for the user as the user does not have to manually input information such as property information of a device or electrical connections of the device. Further, since the circuit schematic being displayed is based on the template, which has been previously registered after being evaluated, the user is able to design a circuit with improved accuracy.

Figure 7:
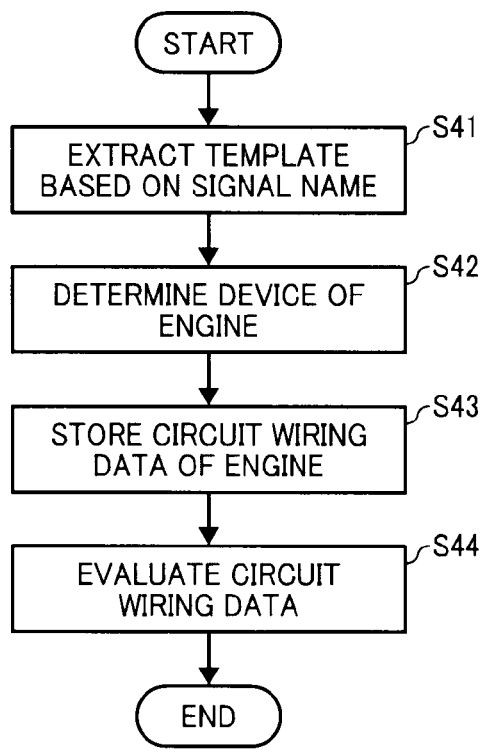
FIG. 7 is a flowchart illustrating operation of generating a circuit diagram of a driver section, performed by the system of FIG. 1, according to an example embodiment of the present invention.
Figure 8:
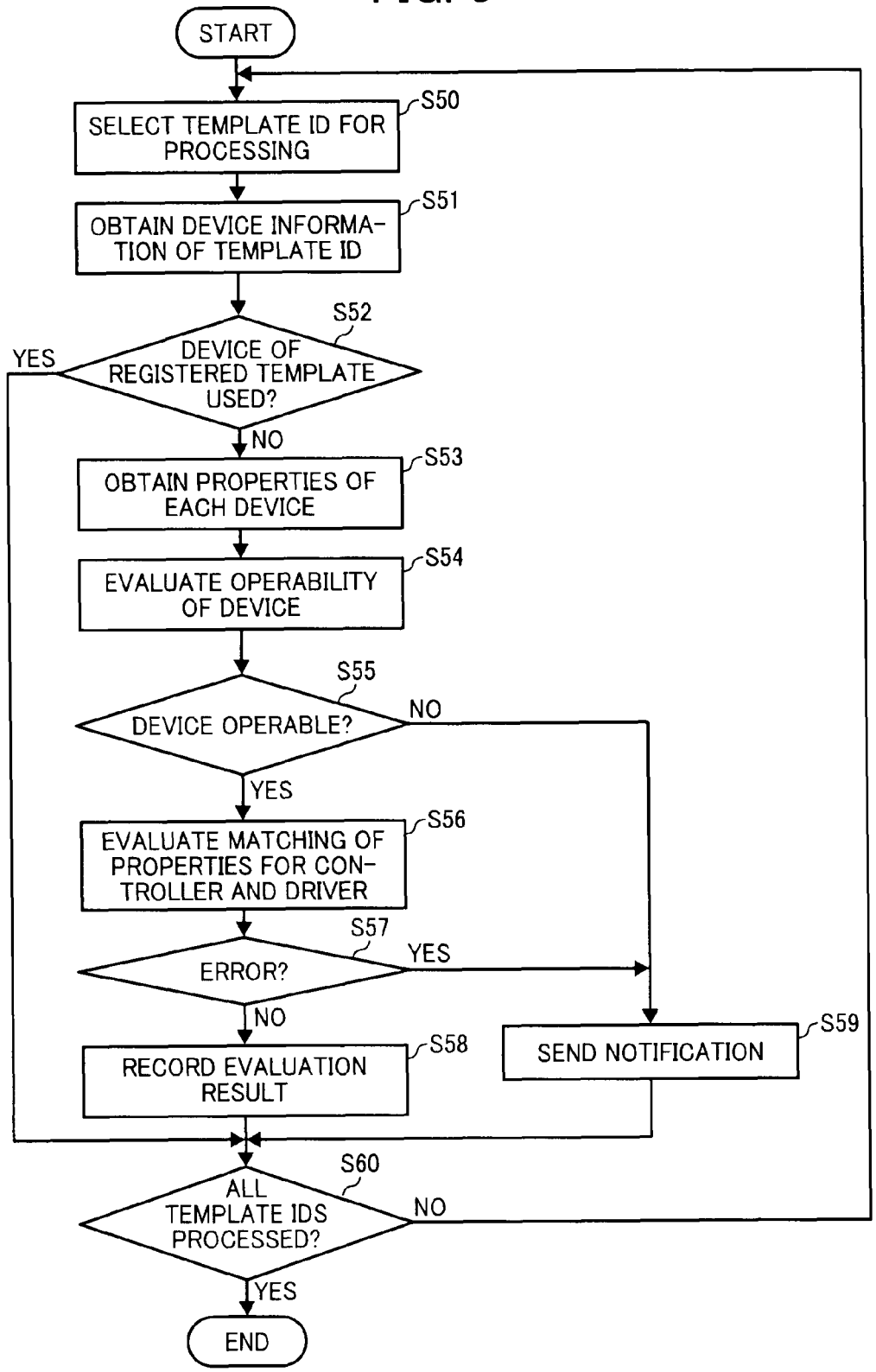
FIG. 8 is a flowchart illustrating operation of evaluating designed circuit wiring data of the engine section, performed by the system of FIG. 1, according to an example embodiment of the present invention.

Referring now to FIGS. 7 and 8, operation of generating a circuit diagram of the engine section, performed at S17 of FIG. 4, is explained according to an example embodiment of the present invention.

In operation, according to a user instruction, the terminal 10 executes the circuit design program stored in the memory to display a menu screen based on the menu data including a circuit creation button. When the circuit creation button is selected, the controller unit of the terminal 10 displays a circuit information input screen on the display unit based on the circuit information input screen data. When the user inputs information regarding a substrate ID and a machine type ID through the circuit information input screen, and selects the design start button, the controller unit of the terminal 10 stores the substrate ID and the machine type ID in its internal memory, and displays a circuit design screen such as the circuit design screen 600. The controller unit of the terminal 10 sends the machine type ID to the circuit design assist server 20, and obtains a list of signal types that corresponds to the machine type ID for display on the circuit design screen 600.

At S41, the terminal 10 extracts a template based on the signal name. In a substantially similar manner as described above referring to S34 of FIG. 6, the controller unit of the terminal 10 obtains one or more template management records 240 that correspond to the selected signal type from the circuit design assist server 20, and displays a list of signal names on the signal name list 640. When the signal name is selected, the terminal 10 sends the selected signal name to the circuit design assist server 20. The terminal 10 further obtains a template management record 240 that corresponds to the selected signal name, and displays a device and its wiring connections obtained from the template management record 240 on the circuit creation screen 620. The controller unit of the terminal 10 generates circuit wiring data including a device ID, pin number, signal ID, device address, and template ID for the device, and stores the circuit wiring data in its internal memory. Further, the controller unit of the terminal 10 stores the template ID in association with the signal ID of the signal transmission line being displayed in its internal memory.

At S42, the terminal 10 determines a device of the engine section. For example, when the user decides to use the device included in the template circuit, which is displayed in the circuit creation area 620 of the circuit design screen 600, for the engine section, the controller unit of the terminal 10 generates a circuit wiring record that reflects a user input, and stores the circuit wiring record in its internal memory.

When the user decides not to use the device included in the template circuit for various reasons, the terminal 10 deletes the display of device on the circuit creation area 620, and displays another device according to a user input. In such case, the controller unit of the terminal 10 generates a circuit wiring record including a device address and a device ID of the device that is selected in alternative to the deleted device, and stores the circuit wiring record in its internal memory. Further, the terminal 10 specifies a signal ID of the signal transmission line of the device, and a pin number of a terminal connected to the signal assigned with the signal ID to be stored in its internal memory as the circuit wiring record.

When the circuit design for the engine section is completed, the user selects the registration button of the edit tool area 610. The controller unit of the terminal 10 sends the circuit wiring record that is previously stored, the machine type ID, and the substrate ID, to the circuit design assist server 20.

At S43, the controller 21 of the circuit design assist server 20 stores the designed circuit wiring data for the engine section. For example, the controller 21 of the circuit design assist server 20 generates a designed circuit connection record 250 that stores the machine type ID and the substrate ID in association with the circuit wiring record, and stores the designed circuit connection record 250 in the designed circuit connection data storage 25. The above-described operation of designing a circuit may be repeated to create any desired number of circuits for the engine section.

At S44, the controller 21 of the circuit design assist server 20 evaluates operability of the engine section based on the designed circuit wiring data, and the operation ends.

Referring now to FIG. 8, operation of evaluating operability of the engine section, performed at S44, is explained.

At S50, the controller 21 of the circuit design assist server 20 extracts a template ID from the designed circuit connection record 250 as a selected template ID for further processing.

At S51, the controller 21 obtains device information that corresponds to the selected template ID. For example, the connection evaluator 215 of the controller 21 extracts a designed circuit connection record 250 storing the selected template ID from the designed circuit connection records 250 that are generated at S43 of FIG. 4. Further, the connection evaluator 215 of the controller 21 extracts one or more designed circuit connection records 250 each of which stores a machine type ID obtained from the extracted designed circuit connection record and a substrate ID other than a substrate ID obtained from the extracted designed circuit connection record, from the designed circuit connection data storage 25.

At S52, the connection evaluator 215 of the controller 21 determines whether a device of the designed circuit is a device used for the template circuit. For example, the connection evaluator 215 extracts shape data of the template management record 240 including the selected template ID, from the template management data storage 24. The connection evaluator 215 determines whether the device ID obtained from the designed circuit connection record 250 at S51 matches the device ID included in the shape data of the template management record 240. When more than one device is included in the designed circuit connection record 250, all devices are checked.

When the device ID of the designed circuit connection record 250 matches the device ID of the shape data of the template management record 240, the connection evaluator 215 determines that the device is a template device ("YES" at S52), and ends the operation for the selected template ID.

When the device ID of the designed circuit connection record 250 does not match the device ID of the shape data of the template management record 240, the connection evaluator 215 determines that the device is not a template device ("NO" at S52), and the operation proceeds to S53.

At S53, the connection evaluator 215 obtains property information that is stored in association with the device ID obtained from the designed circuit connection record 250. More specifically, the evaluator 215 extracts a device management record 220 that stores the obtained device ID from the device management data storage 22.

At S54, the connection evaluator 215 of the controller 21 performs operability simulation using the candidate device of the engine section and the device of the controller section. For example, the connection evaluator 215 inputs the property information of the device to the circuit simulator to generate an evaluation result.

When it is determined that the evaluation result indicates the device is operable ("YES" at S55), the connection evaluator 215 of the controller 21 determines whether the candidate device of the engine section and the device of the controller section match based on their characteristics. At this time, the connection evaluator 215 determines whether any error has been reported for the candidate device of the engine section and the device of the controller section.

For example, the connection evaluator 215 extracts one or more evaluation result records 260 each of which stores the selected template ID from the evaluation result data storage 26. The connection evaluator 215 extracts one or more evaluation result records 260 having the "OK" flag, out of the extracted evaluation result records 260, and specifies a device ID of the used device ID data area of the extracted evaluation result record 260 having the "OK" flag for each of the evaluation result records 260. Further, the connection evaluator 215 obtains property information of the specified device ID from the device management data storage 22.

The connection evaluator 215 compares between a specification value of property information of the device that is obtained from the evaluation result record 260 having the "OK" flag and a specification value of property information of the device that is obtained from the designed circuit connection record 250 at S51 to generate a comparison result. Based on the comparison result, the connection evaluator 215 determines an allowable range of specification values of property information of the device in the designed circuit.

Figure 11:
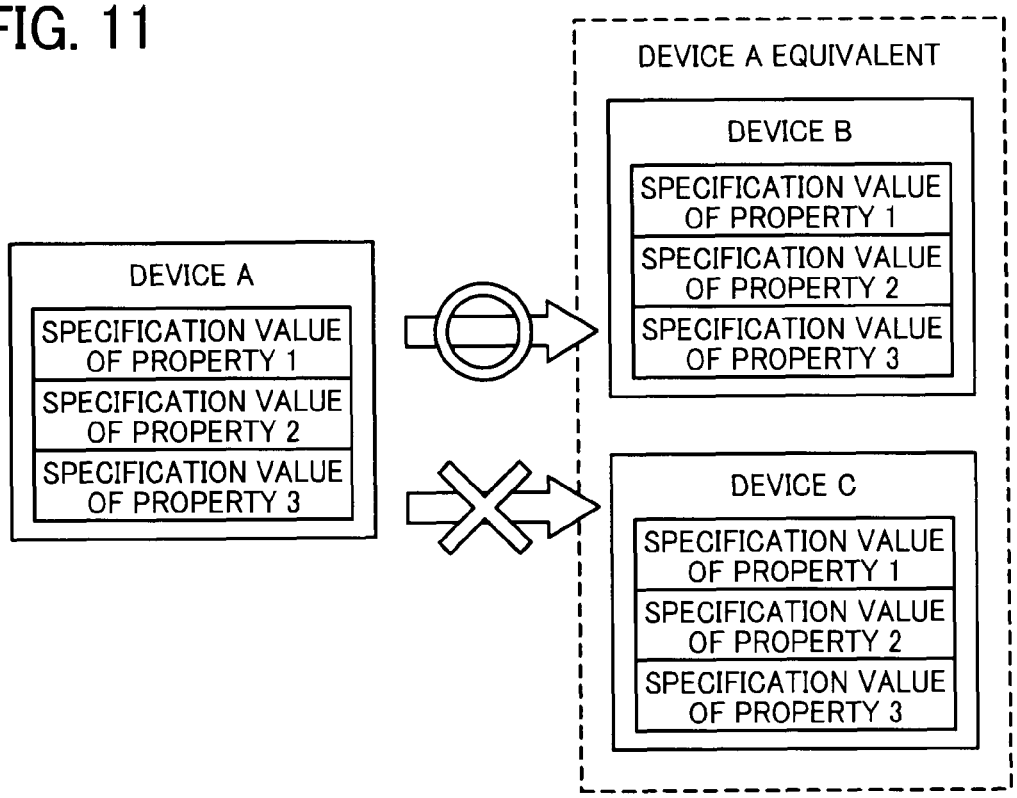
FIG. 11 is an illustration for explaining operation of evaluating an equivalent device of a specific device, preformed by the system of FIG. 1.
Figure 12A:
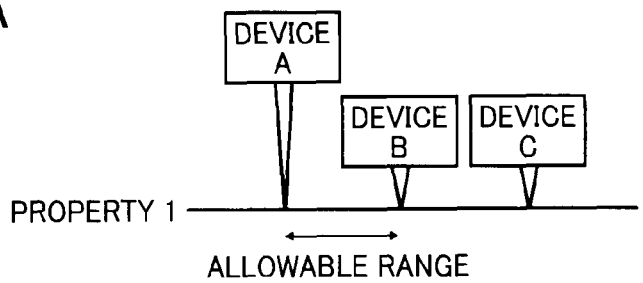
FIG. 12A is an illustration for explaining operation of defining an allowable range of specification values of property information of the specific device of FIG. 11 based on specification values of property information obtained for the equivalent device of FIG. 11, preformed by the system of FIG. 1.
Figure 12B:
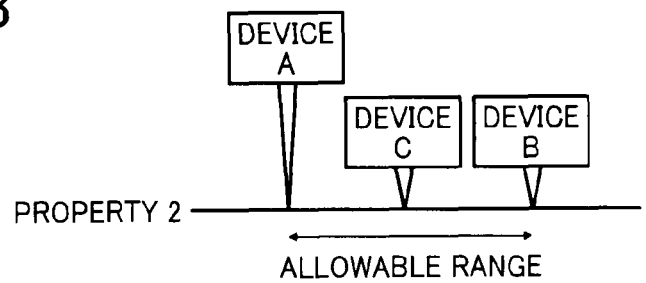
FIG. 12B is an illustration for explaining operation of defining an allowable range of specification values of property information of the specific device of FIG. 11 based on specification values of property information obtained for the equivalent device of FIG. 11, preformed by the system of FIG. 1.

For example, as illustrated in FIG. 11, the connection evaluator 215 evaluates operability of a device A of the designed circuit, which is defined with property 1, property 2, and property 3. The device A has two equivalent devices including a device B and a device C, which are obtained from the evaluation result records 260. In this example, it is assumed that the device B has not caused any error in operation, while the device C has caused an error in operation. More specifically, the device B is stored in association with the "OK" flag, and the device C is stored in association with the "warning" flag. The allowable range of specification values for the device A is defined based on the specification value of the device B that has caused no error. In one example, as illustrated in FIG. 12A, the allowable range of specification values for the property 1 of the device A is determined based on the specification value of property 1 of the device B. In another example, as illustrated in FIG. 12B, the allowable range of specification values for the property 2 of the device A is determined based on the specification value of property 2 of the device B.

At S57, the connection evaluator 215 of the controller 21 determines whether a specification value of property information of the device of the designed circuit falls out of this allowable range. When it is determined that the specification value of property information of the device is within the allowable range ("NO" at S57), the operation proceeds to S58 to record an evaluation result. More specifically, at S58, the connection evaluator 215 stores the "OK" flag indicating that the connection is evaluated in association with the selected template ID.

When it is determined that the device is not operable ("NO" at S55) or when it is determined that the specification value of property information of the device falls out of the allowable range ("YES" at S57), the operation proceeds to S59 to send notification. More specifically, at S59, the connection evaluator 215 stores the warning flag in association with the designed circuit connection record of the selected template ID. The connection evaluator 215 sends the designed circuit connection record to the terminal 10 to cause the terminal 10 to display a circuit based on the designed circuit connection record.

As described above referring to FIG. 4, after creation of the template at S14, the operation proceeds to S15 to evaluate operability of the template to generate an evaluation result and register the template based on the evaluation result.

More specifically, as described above referring to FIG. 5, the controller 21 of the circuit design assist server 20 extracts property information of the candidate device included in the template circuit (S21), generates a plurality of patterns each having different combination of specification values of property information of the device (S22), and evaluates operability of each pattern (S23) to generate an evaluation result. When the evaluation result indicates that there is no pattern that would cause an error ("NO" at S29), the controller 21 registers the template (S30). With this function of automatically evaluating the device designed for use in the template and registering the device only when its operability is checked, the user is able to design a circuit with improved efficiency. Since the circuit design assist server 20 automatically generates all possible combinations of specification values of property of the device, the user does not have to manually prepare such combinations. Further, since the device is registered for use in the template circuit only when it is determined that the device is not most likely to cause an error, the user does not have to evaluate operability of the registered device after the user actually designs a circuit using the template.

Further, as described above referring to FIG. 4, the circuit design assist server 20 generates a circuit diagram of the controller section or the engine section according to a user instruction (S16 and S17). In operation, the circuit design assist server 20 extracts a template that corresponds to a signal name identified by the user. Based on the extracted template, the user determines a device for use in circuit. For example, the circuit design assist server 20 displays a list of available devices to the user for selection together with related information that is stored with respect to each device. Accordingly, the user does not have to input detailed information regarding the device for the circuit such that the user is able to design a circuit with improved efficiency.

As described above referring to S34 of FIG. 6 and S41 of FIG. 7, when the user decides to use a device ("unregistered device") other than the device of the template, the circuit design assist server 20 causes the terminal 10 to display a symbol image of the unregistered device on a screen, for example, in the circuit creation area 620 of the screen 600 of FIG. 10. According to a user instruction, the terminal 10 generates, for the unregistered device, circuit wiring data that stores a device address, device ID, pin number of a terminal connected to a signal transmission line, a signal ID of the signal transmission line, and a template ID corresponding to the signal ID, and stores the circuit wiring data in its internal memory. Accordingly, even when the unregistered device, which is not registered as a template, is used, the unregistered device is stored in association with the template currently extracted for circuit design.

Further, as described above referring to FIG. 8, the circuit design assist server 20 evaluates the designed circuit wiring data of the engine section to check for operability of the engine section (S54), when the unregistered device is used for the engine section. Further, when it is determined that the designed circuit of the engine section is operable, the circuit design assist server 20 checks whether the candidate device, which is the unregistered device, of the engine section matches in characteristics with the device of the controller section (S56). More specifically, the circuit design assist server 20 determines whether the candidate device has caused an error based on information regarding previous use of the candidate device or previous use of an equivalent device of the candidate device. Further, the circuit design assist server 20 determines whether a specification value of property of the candidate device falls within an allowable range that is specified based on information regarding another equivalent device that may be used in alternative to the candidate device. Accordingly, even when the device that is not registered as a template device is to be used, the circuit design assist server 20 is able to provide information indicating whether the device is most likely to cause an error.

Numerous additional modifications and variations are possible in light of the above teachings. It is therefore to be understood that within the scope of the appended claims, the disclosure of the present invention may be practiced otherwise than as specifically described herein.

With some embodiments of the present invention having thus been described, it will be obvious that the same may be varied in many ways. Such variations are not to be regarded as a departure from the spirit and scope of the present invention, and all such modifications are intended to be included within the scope of the present invention.

For example, elements and/or features of different illustrative embodiments may be combined with each other and/or substituted for each other within the scope of this disclosure and appended claims.

In one example, referring back to FIG. 1, the circuit generator 211, the template evaluator 212, the template registrar 213, the designed circuit registrar 214, and the connection evaluator 215 may alternatively be incorporated into the controller unit of the terminal 10. In such case, the device management data storage 22, the product plan data storage 23, and the template management data storage 24 may also be incorporated into the terminal 10. In example operation, when evaluation for a template that is created is completed, the controller unit of the terminal 10 may send data regarding the template to the circuit design assist server 20 at the time when the terminal 10 registers the template in the template management data storage 24 (S30 of FIG. 5). Further, at the time of storing designed circuit wiring data (S36 of FIG. 6) or at the time of storing the evaluation result (S44 of FIG. 7), the controller unit of the terminal 10 may send data to the circuit design assist server 20 to cause the data to be stored in the designed circuit connection data storage 25 and the evaluation result data storage 26. Alternatively, the controller 21 of the circuit design assist server 20 may periodically send the updated template management data to the terminal 10. Once the updated template management data is stored in the memory of the terminal 10, the terminal 10 does not have to keep connected to the circuit design assist server 20 to perform circuit design operation.

In the above-described example referring to FIGS. 1 to 12, one or more templates are previously registered for an interface circuit provided between the controller section and the engine section for signal transmission or reception. Any desired template may be previously registered for a circuit that processes a signal to be transmitted between at least two circuits that are most likely to be designed at different times. For example, when designing a plurality of printed circuit boards of the engine section, one portion of the engine section may be designed after a few months has passed from the time when the previously destined portion of the engine section is designed. In such case, the previously designed portion of the engine section may be registered as a template in association with a signal to be transmitted or received through the printed circuit boards of the engine section, after evaluating operability of the previously designed portion of the engine section.

In the above-described example referring to S56 of FIG. 8, the controller 21 of the circuit design assist server 20 defines an allowable range based on information regarding a specification value of property information of the device that has caused no error, and evaluates the candidate device based on determination whether the specification value of property information of the candidate device falls within the allowable range. Alternatively, the controller 21 of the circuit design assist server 20 may define a prohibited range based on a specification value of property information of the device that has caused an error, and evaluates the candidate device based on determination whether the specification value of property information of the candidate device falls out of the prohibited range. More specifically, the controller 21 extracts an evaluation result record 260 that corresponds to the selected template ID from the evaluation result data storage 26, extracts an evaluation result record 260 having an error flag, and specifies a device ID included in the used device ID data area of the extracted evaluation result record 260 with the error flag. The controller 21 obtains a specification value of property information of the specified device ID from the device management data storage 22.

The controller 21 compares a specification value of property information of the device that is associated with the error flag with a specification value of property information of the device in the designed circuit to generate a comparison result. When the comparison result indicates that a specification value of property information of the candidate device falls out of the prohibited range determined based on a specification value of property information of the device with the error flag, the operation proceeds to S58 to record an evaluation result.

Alternatively, the controller 21 of the circuit design assist server 20 may specify a device having a specification value of property information that is close to the specification value of property information of the candidate device, and refers to an evaluation result of the specified device to determine whether the specification value of property information of the device is within the allowable range. For example, the controller 21 obtains property information that is associated with the used device ID of the evaluation result record 260 of the selected template ID, and the property information of the candidate device, from the device management data storage 22. The controller 21 specifies a used device ID having a specification value of property information that is close to a specification value of property information of the candidate device, and obtains an evaluated result record 260 from the evaluation result data storage 26. When an evaluation result data area of the obtained evaluated result record 260 is stored with the "OK" flag, the controller 21 determines that the specification value of property information of the device of the designed circuit falls within this allowable range.

Further, any one of the data stored in the storages 22, 23, 24, 25, and 26 of FIG. 1 may be collectively stored in one storage unit or stored in more than one storage unit as long as the controller 21 of the circuit design assist server 20 or the controller unit of the terminal 10 can access the data. Further, any one of records of the data stored in the storages 22, 23, 24, 25, and 26 of FIG. 1 may be stored in any other recording medium such as a removable recording medium.

Further, as described above, any one of the above-described and other methods of the present invention may be embodied in the form of a computer program stored in any kind of storage medium. Examples of storage mediums include, but are not limited to, flexible disk, hard disk, optical discs, magneto-optical discs, magnetic tapes, involatile memory cards, ROM (read-only-memory), etc.

Alternatively, any one of the above-described and other methods of the present invention may be implemented by ASIC, prepared by interconnecting an appropriate network of conventional component circuits or by a combination thereof with one or more conventional general purpose microprocessors and/or signal processors programmed accordingly.

In one example, the present invention may reside in a circuit design assist system including a device management data storage unit, a template management storage unit, and a controller unit. The device management data storage unit stores device management data that associates a device identifier for specifying a device with specification values of electrical properties of the device. The template management storage unit stores template management data that associates a signal identifier for specifying a signal to be transmitted or received between circuits mounted on different substrates, a device identifier for specifying a device connected to a signal transmission line of the signal, and data regarding wiring of the device. The controller unit assists a user in designing a circuit through a terminal, and is provided with a template evaluator, a template registrar, and a template display. When a user instruction for registering a template is received from the user through the terminal, the template evaluator of the controller unit extracts specification values of electrical properties that correspond to a device identifier of a device included in the template from the device management data storage unit. The template evaluator of the controller unit further generates a plurality of patterns of electrical properties of each device connected to a signal assigned with a signal identifier that corresponds to the template. The template evaluator of the controller unit evaluates electrical properties of the device included in the template using the plurality of patterns to generate an evaluation result. When the evaluation result indicates that the template is not most likely to cause an error, the template registrar of the controller unit registers the template. When a user instruction for specifying a signal identifier that identifies the registered template is received from the user through the terminal, the template display of the controller unit extracts a circuit diagram of template management data that is associated with the signal identifier from the template management storage unit, and displays the circuit diagram to the user through the terminal.

According to this example, when a user instruction for registering a template is received, the controller extracts specification values of electrical properties that correspond to a device identifier of a device constituting the template circuit from the device management data storage unit. The controller unit further generates a plurality of patterns respectively having different combinations of electric properties of each device connected to a signal assigned with a signal identifier of the template, and evaluates operability of electrical properties of the device based on the plurality of patterns to generate an evaluation result. When the evaluation result indicates that the device is not most likely to cause an error, the controller unit registers the template. When a user instruction for specifying a signal identifier that identifies the registered template is received from the user through the terminal, the controller unit extracts a circuit diagram of template management data that is associated with the signal identifier from the template management storage unit for display to the user through the terminal. Accordingly, the system automatically evaluates a template to be registered for all possible patterns of different combinations of electrical properties of a device of the template circuit, before registering the template. Further, only when the evaluation result indicates that the device is not most likely to cause an error, the template is registered. Further, the system stores information regarding the template in association with a signal identifier of a signal. This allows the user to design a circuit with improved efficiency.

In another example, the circuit design assist system further includes a designed circuit connection data storage unit that stores a device identifier of a device of a circuit and connection data of the device, and a designed circuit registrar. The template management data includes a template identifier for specifying the template. When there is a device newly displayed on an area in which the circuit diagram of the template management data is displayed, the designed circuit registrar of the controller stores, in the designed circuit connection data storage unit, the template identifier of the template management data in association with a device identifier of a device connected to the signal transmission line of a signal identifier of the template.

In this example, when there is a device newly displayed on an area in which the circuit diagram of template management data is displayed, the controller stores, in the designed circuit connection data storage unit, a template identifier of template management data in association with a device identifier of a device connected to a signal transmission line of a signal assigned with the template signal identifier. Accordingly, even when a device other than the device registered with the template circuit is used, information regarding the unregistered device is stored in association with the template of the registered device.

In another example, the circuit design assist system further includes an evaluation result storage unit that stores evaluation result data including the template identifier, a device identifier of a device used for the template, a used device identifier of a used device that has been used, and an evaluation result in a corresponding manner. When a device identifier of the device included in a circuit to be registered is associated with a template identifier, the controller obtains evaluation result data that corresponds to the device identifier included in the template assigned with the template identifier from the evaluation result storage unit. The controller unit further defines an allowable range of specification values of electrical properties of the used device included in the evaluation result data, and determines whether specification values of electrical properties of the device included in the circuit to be registered fall within the allowable range to generate a comparison result. When the comparison result indicates that the specification values of electrical properties of the device included in the circuit to be registered fall out of the allowable range, the controller sends notification to the user through the terminal.

In this example, when a device identifier of a device included in a circuit to be registered is associated with a template identifier, the controller unit obtains evaluation result data that is associated with a device identifier included in a template of the template identifier from the evaluation result storage unit. The controller unit further defines an allowable range of specification values of electrical properties of a used device included in the evaluation result data, and determines whether specification values of electrical properties of the device included in the circuit to be registered fall within the allowable range to generate a comparison result. When the comparison result indicates that the specification values of electrical properties of the device included in the circuit to be registered fall out of the allowable range, the controller sends notification to the user through the terminal. Accordingly, the system is able to warn the user when the evaluation result previously obtained for the device in the circuit to be registered indicates that the use of the device in the circuit to be registered is mostly likely to cause an error. In alternative to using the evaluation result obtained for the device in the circuit to be registered, the evaluation result previously obtained for an equivalent device that may be used in replace of the device in the circuit to be registered may be used.

In another example, the present invention may reside in a method of assisting a user in designing a circuit through a terminal, the method including: storing, in a device management data storage unit, device management data that associates a device identifier for specifying a device with specification values of electrical properties of the device; storing, in a template management storage unit, template management data that associates a signal identifier for specifying a signal to be transmitted or received between circuits mounted on different substrates, a device identifier for specifying a device connected to a signal transmission line of the signal, and data regarding wiring of the device; when a user instruction for registering a template is received from the user through the terminal, extracting specification values of electrical properties that correspond to a device identifier of a device included in the template from the device management data storage unit; generating a plurality of patterns of specification values of electrical properties of each device connected to a signal assigned with a signal identifier that corresponds to the template; evaluating specification values of electrical properties of the device included in the template using the plurality of patterns to generate an evaluation result; registering the template when the evaluation result indicates that the template is not most likely to cause an error; when a user instruction for specifying a signal identifier that identifies the registered template is received from the user through the terminal, extracting a circuit diagram of template management data that is associated with the signal identifier from the template management storage unit; and displaying the circuit diagram to the user through the terminal.

In another example, the present invention may reside in a plurality of instructions which cause a processor to perform the above-described method of assisting a user in designing a circuit through a terminal.

In another example, the present invention may reside in a recording medium storing a plurality of instructions which cause a processor to perform the above-described method of assisting a user in designing a circuit through a terminal.

In one example, the present invention may reside in: a circuit design assist system including: means for storing device management data that associates, for each one of a plurality of devices, a device identifier for specifying one device and specification values of electrical properties of the specified device; means for storing template management data including information regarding a template; means for receiving a user instruction for registering an interface section of at least two circuits to be respectively mounted on different substrates as the template, the interface section including a signal transmission line that connects the at least two circuits, and at least one device that is connected to the signal transmission line and defined with electrical property information; means for obtaining specification values of electrical properties of the at least one device of the interface section that satisfy the electrical property information using the device management data; means for generating a plurality of circuit patterns of the interface section each having a different combination of the obtained specification values of electrical properties of the at least one device; evaluating operability of each of the plurality of circuit patterns to generate an evaluation result; means for registering the interface section as the template to create a record in the template management data when the evaluation result indicates that the interface section operates normally for each of the plurality of circuit patterns, the record of the template management data including a signal identifier for specifying a signal to be transmitted through the signal transmission line that connects the at least two circuits, a device identifier for specifying the at least one device of the interface section, and circuit schematic information for specifying electrical connections of the at least one device of the interface section; obtaining a user instruction for specifying a signal identifier; means for extracting circuit schematic information of a record of the template management data having the signal identifier specified by the user instruction; and means for displaying data generated based on the extracted circuit schematic information on a screen to allow the user to design a new circuit using the extracted circuit schematic information.

In one example, the above-described circuit design assist system further includes: means for storing designed circuit connection data that associates, for each one of devices included in the new circuit, a device identifier for specifying one device and information indicating electrical connections of the specified device; means for receiving a user instruction for displaying a different device that is not specified by the extracted circuit schematic information on the screen; and means for associating a device identifier for specifying the different device included in the designed circuit connection data with a template identifier for specifying the record of the template management data created for the registered template from which the extracted circuit schematic information is extracted.

In one example, the above-described circuit design assist system further includes: means for storing evaluation result data that associates, for the device identifier for specifying the at least one device of the interface section registered as the template, a device identifier for specifying a used device that has been implemented, and an evaluation result indicating whether the used device operates normally; means for receiving a user instruction for registering the new circuit; means for obtaining the device identifier of one of the devices included in the new circuit from the designed circuit connection data; means for extracting a device identifier and an evaluation result that correspond to the obtained device identifier from the evaluation result data; specifying an allowable range of specification values of electrical properties of the one of the devices included in the new circuit based on specification values of electrical properties of the used device that is obtained using the extracted device identifier and the evaluation result; means for determining whether specification values of electrical properties of the one of the devices included in the new circuit fall within the allowable range to generate a determination result; and means for sending notification when the determination result indicates that the specification values of electrical properties of the one of the devices included in the new circuit fall out of the allowable range.

What is claimed is:

1. A circuit design assist system, comprising:
    a memory configured to store device management data that associates, for each one of a plurality of devices, a device identifier for specifying one device with specification values of electrical properties of the specified device;
    a memory configured to store template management data including information regarding a template; and
    a controller unit configured to assist a user in designing a circuit, the controller unit further configured to:
    receive a user instruction for registering an interface section of at least two circuits to be respectively mounted on different substrates as the template, the interface section including a signal transmission line that connects the at least two circuits, and at least one device that is connected to the signal transmission line and defined with electrical property information;
    obtain specification values of electrical properties of the at least one device of the interface section that satisfy the electrical property information using the device management data;
    generate a plurality of circuit patterns of the interface section each having a different combination of the obtained specification values of electrical properties of the at least one device, the plurality of circuit patterns including all combinations of the obtained specification values of electrical properties;
    evaluate operability of each of the plurality of circuit patterns to generate an evaluation result;
    register the interface section as the template to create a record in the template management data when the evaluation result indicates that the interface section operates normally for each of the plurality of circuit patterns, the record of the template management data including a signal identifier for specifying a signal to be transmitted through the signal transmission line that connects the at least two circuits, a device identifier for specifying the at least one device of the interface section, and circuit schematic information for specifying electrical connections of the at least one device of the interface section, wherein
    when the controller unit obtains a user instruction for specifying a signal identifier, the controller unit is further configured to:
    extract circuit schematic information of a record of the template management data having the signal identifier specified by the user instruction; and
    display data generated based on the extracted circuit schematic information on a screen to allow the user to design a new circuit using the extracted circuit schematic information.

2. The circuit design assist system of claim 1, further comprising:
    a memory configured to store designed circuit connection data that associates, for each one of devices included in the new circuit, a device identifier of one device with information indicating electrical connections of the specified device, wherein
    when the controller unit further receives a user instruction for displaying a different device that is not specified by the extracted circuit schematic information on the screen, the controller unit associates a device identifier for specifying the different device included in the designed circuit connection data with a template identifier for specifying the record of the template management data created for the registered template from which the extracted circuit schematic information is extracted.

3. The circuit design assist system of claim 2, further comprising:
    a memory configured to store evaluation result data that associates, for the device identifier for specifying the at least one device of the interface section registered as the template, a device identifier for specifying a used device that has been implemented with an evaluation result indicating whether the used device operates normally, wherein
    when the controller unit further receives a user instruction for registering the new circuit, the controller unit is further configured to:

obtain the device identifier of one of the devices included in the new circuit from the designed circuit connection data;

extract a device identifier and an evaluation result that correspond to the obtained device identifier from the evaluation result data;

specify an allowable range of specification values of electrical properties of the one of the devices included in the new circuit based on specification values of electrical properties of the used device that is obtained using the extracted device identifier and the evaluation result;

determine whether specification values of electrical properties of the one of the devices included in the new circuit fall within the allowable range to generate a determination result; and send notification when the determination result indicates that the specification values of electrical properties of the one of the devices included in the new circuit fall out of the allowable range.

4. A computer-implemented circuit design assist method for assisting a user in designing a circuit, the method comprising:

storing, in a memory, device management data that associates, for each one of a plurality of devices, a device identifier for specifying one device with specification values of electrical properties of the specified device;

storing, in a memory, template management data including information regarding a template;

receiving a user instruction for registering an interface section of at least two circuits to be respectively mounted on different substrates as the template, the interface section including a signal transmission line that connects the at least two circuits, and at least one device that is connected to the signal transmission line and defined with electrical property information;

obtaining specification values of electrical properties of the at least one device of the interface section that satisfy the electrical property information using the device management data;

generating a plurality of circuit patterns of the interface section each having a different combination of the obtained specification values of electrical properties of the at least one device, the plurality of circuit patterns including all combinations of the obtained specification values of electrical properties;

evaluating, by a processor, operability of each of the plurality of circuit patterns to generate an evaluation result;

registering the interface section as the template to create a record in the template management data when the evaluation result indicates that the interface section operates normally for each of the plurality of circuit patterns, the record of the template management data including a signal identifier for specifying a signal to be transmitted through the signal transmission line that connects the at least two circuits, a device identifier for specifying the at least one device of the interface section, and circuit schematic information for specifying electrical connections of the at least one device of the interface section;

obtaining a user instruction for specifying a signal identifier;

extracting circuit schematic information of a record of the template management data having the signal identifier specified by the user instruction; and displaying data generated based on the extracted circuit schematic information on a screen to allow the user to design a new circuit using the extracted circuit schematic information.

5. The computer-implemented circuit design assist method of claim 4, further comprising:

storing, in a memory, designed circuit connection data that associates, for each one of devices included in the new circuit, a device identifier for specifying one device with information indicating electrical connections of the specified device;

receiving a user instruction for displaying a different device that is not specified by the extracted circuit schematic information on the screen; and associating a device identifier for specifying the different device included in the designed circuit connection data with a template identifier for specifying the record of the template management data created for the registered template from which the extracted circuit schematic information is extracted.

6. The computer-implemented circuit design assist method of claim 5, further comprising:

storing, in a memory, evaluation result data that associates, for the device identifier for specifying the at least one device of the interface section registered as the template, a device identifier for specifying a used device that has been implemented with an evaluation result indicating whether the used device operates normally;

receiving a user instruction for registering the new circuit;

obtaining the device identifier of one of the devices included in the new circuit from the designed circuit connection data;

extracting a device identifier and an evaluation result that correspond to the obtained device identifier from the evaluation result data;

specifying an allowable range of specification values of electrical properties of the one of the devices included in the new circuit based on specification values of electrical properties of the used device that is obtained using the extracted device identifier and the evaluation result;

determining whether specification values of electrical properties of the one of the devices included in the new circuit fall within the allowable range to generate a determination result; and sending notification when the determination result indicates that the specification values of electrical properties of the one of the devices included in the new circuit fall out of the allowable range.

7. A non-transitory computer readable storage medium storing a plurality of instructions which, when executed, cause a processor to perform a circuit design assist method for assisting a user in designing a circuit, the method comprising:

storing, in a memory, device management data that associates, for each one of a plurality of devices, a device identifier for specifying one device with specification values of electrical properties of the specified device;

storing, in a memory, template management data including information regarding a template;

receiving a user instruction for registering an interface section of at least two circuits to be respectively mounted on different substrates as the template, the interface section including a signal transmission line that connects the at least two circuits, and at least one device that is connected to the signal transmission line and defined with electrical property information;

obtaining specification values of electrical properties of the at least one device of the interface section that satisfy the electrical property information using the device management data;

generating a plurality of circuit patterns of the interface section each having a different combination of the obtained specification values of electrical properties of the at least one device, the plurality of circuit patterns including all combinations of the obtained specification values of electrical properties;

evaluating operability of each of the plurality of circuit patterns to generate an evaluation result;

registering the interface section as the template to create a record in the template management data when the evaluation result indicates that the interface section operates normally for each of the plurality of circuit patterns, the record of the template management data including a signal identifier for specifying a signal to be transmitted through the signal transmission line that connects the at least two circuits, a device identifier for specifying the at least one device of the interface section, and circuit schematic information for specifying electrical connections of the at least one device of the interface section;

obtaining a user instruction for specifying a signal identifier;

extracting circuit schematic information of a record of the template management data having the signal identifier specified by the user instruction; and displaying data generated based on the extracted circuit schematic information on a screen to allow the user to design a new circuit using the extracted circuit schematic information.

8. The non-transitory computer readable storage medium of claim 7, wherein the circuit design assist method further comprises:

storing, in a memory, designed circuit connection data that associates, for each one of devices included in the new circuit, a device identifier for specifying one device with information indicating electrical connections of the specified device;

receiving a user instruction for displaying a different device that is not specified by the extracted circuit schematic information on the screen; and associating a device identifier for specifying the different device included in the designed circuit connection data with a template identifier for specifying the record of the template management data created for the registered template from which the extracted circuit schematic information is extracted.

9. The non-transitory computer readable storage medium of claim 8, wherein the circuit design assist method further comprises:

storing, in a memory, evaluation result data that associates, for the device identifier for specifying the at least one device of the interface section registered as the template, a device identifier for specifying a used device that has been implemented with an evaluation result indicating whether the used device operates normally;

receiving a user instruction for registering the new circuit;

obtaining the device identifier of one of the devices included in the new circuit from the designed circuit connection data;

extracting a device identifier and an evaluation result that correspond to the obtained device identifier from the evaluation result data;

specifying an allowable range of specification values of electrical properties of the one of the devices included in the new circuit based on specification values of electrical properties of the used device that is obtained using the extracted device identifier and the evaluation result;

determining whether specification values of electrical properties of the one of the devices included in the new circuit fall within the allowable range to generate a determination result; and sending notification when the determination result indicates that the specification values of electrical properties of the one of the devices included in the new circuit fall out of the allowable range.

* * * * *